US009997534B2

(12) United States Patent
Son et al.

(10) Patent No.: US 9,997,534 B2
(45) Date of Patent: Jun. 12, 2018

(54) VERTICAL MEMORY DEVICES

(71) Applicants: Yong-Hoon Son, Yongin-si (KR);
Kyung-Hyun Kim, Seoul (KR);
Byeong-Ju Kim, Hwaseong-si (KR);
Phil-Ouk Nam, Suwon-si (KR);
Kwang Chul Park, Suwon-si (KR);
Yeon-Sil Sohn, Yongin-si (KR); Jin-I Lee, Hwaseong-si (KR); Jong-Heun Lim, Hwaseong-si (KR); Won-Bong Jung, Seoul (KR); Kohji Kanamori, Seoul (KR)

(72) Inventors: Yong-Hoon Son, Yongin-si (KR);
Kyung-Hyun Kim, Seoul (KR);
Byeong-Ju Kim, Hwaseong-si (KR);
Phil-Ouk Nam, Suwon-si (KR);
Kwang Chul Park, Suwon-si (KR);
Yeon-Sil Sohn, Yongin-si (KR); Jin-I Lee, Hwaseong-si (KR); Jong-Heun Lim, Hwaseong-si (KR); Won-Bong Jung, Seoul (KR); Kohji Kanamori, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/155,732

(22) Filed: May 16, 2016

(65) Prior Publication Data
US 2016/0343730 A1      Nov. 24, 2016

(30) Foreign Application Priority Data
May 19, 2015   (KR) .................. 10-2015-0069447

(51) Int. Cl.
| | |
|---|---|
| *H01L 29/792* | (2006.01) |
| *H01L 27/11582* | (2017.01) |
| *H01L 23/528* | (2006.01) |

(52) U.S. Cl.
CPC ...... *H01L 27/11582* (2013.01); *H01L 23/528* (2013.01)

(58) Field of Classification Search
CPC ..... H01L 2924/00014; H01L 27/11582; H01L 2224/29109; H01L 2224/29111; H01L 2224/29116; H01L 2224/29118; H01L 2224/29124; H01L 2224/29144; H01L 2224/29147; H01L 2224/29155;
(Continued)

(56) References Cited

U.S. PATENT DOCUMENTS 8,373,222 B2   2/2013  Sekine et al.
8,569,827 B2  10/2013  Lee et al.
(Continued)

FOREIGN PATENT DOCUMENTS

KR   1020130005433 A   1/2013

*Primary Examiner* — Meiya Li
(74) *Attorney, Agent, or Firm* — Myers Bigel, P.A.

(57) ABSTRACT

A vertical memory device includes a substrate, a channel on the substrate, extending in a vertical direction with respect to a top surface of the substrate, and including a protrusion at a lower portion of the channel, the protrusion extending in a parallel direction with respect to the top surface of the substrate, a semiconductor pattern connecting the protrusion and the substrate, and gate lines stacked and spaced apart from each other in the vertical direction, the gate lines on the protrusion and the semiconductor pattern and surrounding the channel.

19 Claims, 34 Drawing Sheets

(58) Field of Classification Search
CPC ...... H01L 2224/29166; G11C 16/0483; G11C 29/44; G11C 29/81; G11C 29/846; G11C 29/848; G11C 5/02; G11C 5/025; G11C 5/04

See application file for complete search history.

(56) References Cited

U.S. PATENT DOCUMENTS

| | | |
|---|---|---|
| 8,654,579 B2 | 2/2014 | Kim et al. |
| 8,692,314 B2 | 4/2014 | Lee et al. |
| 8,748,249 B2 | 6/2014 | Yang et al. |
| 8,877,591 B2 | 11/2014 | Choe et al. |
| 2011/0194357 A1 | 8/2011 | Han et al. |
| 2014/0087534 A1* | 3/2014 | Choe ................. G11C 16/0483 438/270 |

* cited by examiner

VERTICAL MEMORY DEVICES

CROSS-REFERENCE TO RELATED APPLICATION

This application claims priority under 35 USC § 119 to Korean Patent Application No. 10-2015-0069447, filed on May 19, 2015, in the Korean Intellectual Property Office (KIPO), the contents of which are incorporated by reference herein in their entirety.

BACKGROUND

1. Field

Example embodiments relate to vertical memory devices. More particularly, example embodiments relate to vertical memory devices including vertically stacked gate lines.

2. Description of the Related Art

Recently, a vertical memory device including a plurality of memory cells stacked vertically with respect to a surface of a substrate has been developed for achieving a high degree of integration. In the vertical memory device, a channel having a pillar shape or a cylindrical shape may protrude vertically from the surface of the substrate, and gate lines and insulation layers surrounding the channel may be repeatedly stacked.

As the degree of integration of the vertical memory device becomes greater, the stacked number of the gate lines and the insulation layers may be increased.

SUMMARY

Example embodiments provide vertical memory devices having improved structural and mechanical reliability.

According to example embodiments, there is provided a vertical memory device. The vertical memory device may include a substrate, a channel on the substrate, extending in a vertical direction with respect to a top surface of the substrate, and including a protrusion at a lower portion of the channel, the protrusion extending in a parallel direction with respect to the top surface of the substrate, a semiconductor pattern connecting the protrusion and the substrate, and gate lines stacked and spaced apart from each other in the vertical direction, the gate lines on the protrusion and the semiconductor pattern and surrounding the channel.

In example embodiments, the semiconductor pattern may include polysilicon, amorphous silicon and/or single crystalline silicon.

In example embodiments, the semiconductor pattern may include a horizontal semiconductor pattern contacting the protrusion, and a vertical semiconductor pattern protruding from the top surface of the substrate and contacting the horizontal semiconductor pattern.

In example embodiments, the vertical memory device may further include an impurity region at an upper portion of the vertical semiconductor pattern.

In example embodiments, the horizontal semiconductor pattern and the vertical semiconductor pattern may be integral with each other.

In example embodiments, the vertical semiconductor pattern may be partially buried in an upper portion of the substrate.

In example embodiments, the protrusion may include a first protrusion and a second protrusion spaced apart from each other in the vertical direction.

In example embodiments, the horizontal semiconductor pattern may include a first horizontal semiconductor pattern and a second horizontal semiconductor pattern contacting the first protrusion and the second protrusion, respectively. The vertical semiconductor pattern may contact each of the first horizontal semiconductor pattern and the second horizontal semiconductor pattern.

In example embodiments, the vertical memory device may further include an impurity region at an upper portion of the vertical semiconductor pattern adjacent to the second horizontal semiconductor pattern.

In example embodiments, the vertical memory device may further include a dielectric layer structure on an outer sidewall of the channel. A portion of the dielectric layer structure may cover bottoms of the channel and the protrusion.

In example embodiments, the vertical memory device may further include a lower insulation layer on the top surface of the substrate. The portion of the dielectric layer structure rimy be on the lower insulation layer.

In example embodiments, the portion of the dielectric layer structure may extend through the lower insulation layer to contact the top surface of the substrate. The channel may be physically separated from the top surface of the substrate by the dielectric layer structure.

According to example embodiments, there is provided a vertical memory device. The vertical memory device may include a substrate, insulating interlayer patterns and gate lines alternately and repeatedly stacked on the substrate, a channel extending through the insulating interlayer patterns and the gate lines in a vertical direction with respect to a top surface of the substrate, the channel spaced apart from the substrate in the vertical direction, and a semiconductor pattern connecting the channel and the substrate in a parallel direction with respect to the top surface of the substrate.

In example embodiments, the channel may include a protrusion extending in the parallel direction from a lower portion of the channel. The semiconductor pattern may include a horizontal semiconductor pattern contacting the protrusion, and a vertical semiconductor pattern extending in the vertical direction from the substrate and contacting the horizontal semiconductor pattern.

In example embodiments, the vertical memory device may further include a lower insulation pattern between the top surface of the substrate and the protrusion.

In example embodiments, the horizontal semiconductor pattern may be interposed between the lower insulation pattern and a lowermost insulating interlayer pattern of the insulating interlayer patterns.

According to example embodiments, there is provided a vertical memory device. The vertical memory device may include a substrate, a lower insulation pattern on the substrate, a gate line structure on the lower insulation pattern, the gate line structure including insulating interlayer patterns and gate lines alternately and repeatedly stacked on each other, a channel extending through the insulating interlayer patterns and the gate lines in a vertical direction with respect to a top surface of the substrate, and a protrusion extending in a parallel direction with respect to the top surface of the substrate from a lower portion of the channel, a horizontal semiconductor pattern contacting the protrusion and interposed between the lower insulation layer pattern and a lowermost insulating interlayer pattern of the insulating interlayer patterns, and a vertical semiconductor pattern protruding from the top surface of the substrate and contacting the horizontal semiconductor pattern.

In example embodiments, the horizontal semiconductor pattern and the vertical semiconductor pattern may include the same material, and may be integral with each other.

In example embodiments, the channel may include a plurality of channels in the gate line structure, and the protrusion may include a plurality of protrusions in the gate line structure. The horizontal semiconductor pattern may extend to be in contact with the plurality of the protrusions.

According to example embodiments, there is provided a vertical memory device. The vertical memory device may include a substrate, a plurality of gate lines on the substrate that are stacked in a first direction perpendicular to a top surface of the substrate, a plurality of insulating interlayer patterns on the substrate, respective ones of the plurality of insulating interlayer patterns between adjacent ones of the plurality of gate line, a channel including a first portion and a second portion, a first semiconductor pattern on the top surface of the substrate and extending in the first direction, and a second semiconductor pattern between the substrate and the plurality of insulating interlayer patterns and extending in a second direction perpendicular to the first direction. The first portion may extend in the first direction and penetrate the plurality of gate lines and the plurality of insulating interlayer patterns. The second portion may extend in the second direction perpendicular to the first direction and be between the plurality of insulating interlayer patterns and the substrate. The second semiconductor pattern may contact the first semiconductor pattern and the second portion of the channel.

In example embodiments, the vertical memory device may further include an impurity region in the first semiconductor pattern. The second semiconductor pattern contacts the first semiconductor pattern at the impurity region.

In example embodiments, the vertical memory device may further include a third semiconductor pattern between the substrate and the second semiconductor pattern and extending in the second direction. The channel may further include a third portion that is between the second portion of the channel and the substrate and that extends in the second direction. The third semiconductor pattern may contact the third portion of the channel and the first semiconductor pattern.

In example embodiments, the vertical memory device may further include a dielectric layer structure, the dielectric layer structure including a first segment extending in the second direction between the second portion of the channel and the substrate.

In example embodiments, the dielectric layer structure may further include a second segment that contacts the top surface of the substrate. A bottom surface of the second segment of the dielectric layer structure may be nearer the top surface of the substrate than a bottom surface of the first segment of the dielectric layer structure.

BRIEF DESCRIPTION OF THE DRAWINGS

Example embodiments will be more dearly understood from the following detailed description taken in conjunction with the accompanying drawings.

FIG. 1 is a cross-sectional view illustrating a vertical memory device in accordance with example embodiments;

FIG. 2 is a cross-sectional view illustrating a vertical memory device in accordance with example embodiments;

FIGS. 3 to 15 are cross-sectional views illustrating methods of manufacturing a vertical memory device in accordance with example embodiments;

FIGS. 16 to 20 are cross-sectional views illustrating methods of manufacturing a vertical memory device in accordance with some example embodiments;

FIGS. 21 to 26 are cross-sectional views illustrating methods of manufacturing a vertical memory device in accordance with some example embodiments;

FIGS. 27 to 32 are cross-sectional views illustrating methods of manufacturing a vertical memory device in accordance with example embodiments;

FIG. 33 is a cross-sectional view illustrating a vertical memory device in accordance with some example embodiments; and FIG. 34 is a cross-sectional view illustrating a vertical memory device in accordance with some example embodiments.

DETAILED DESCRIPTION

Figure 1:
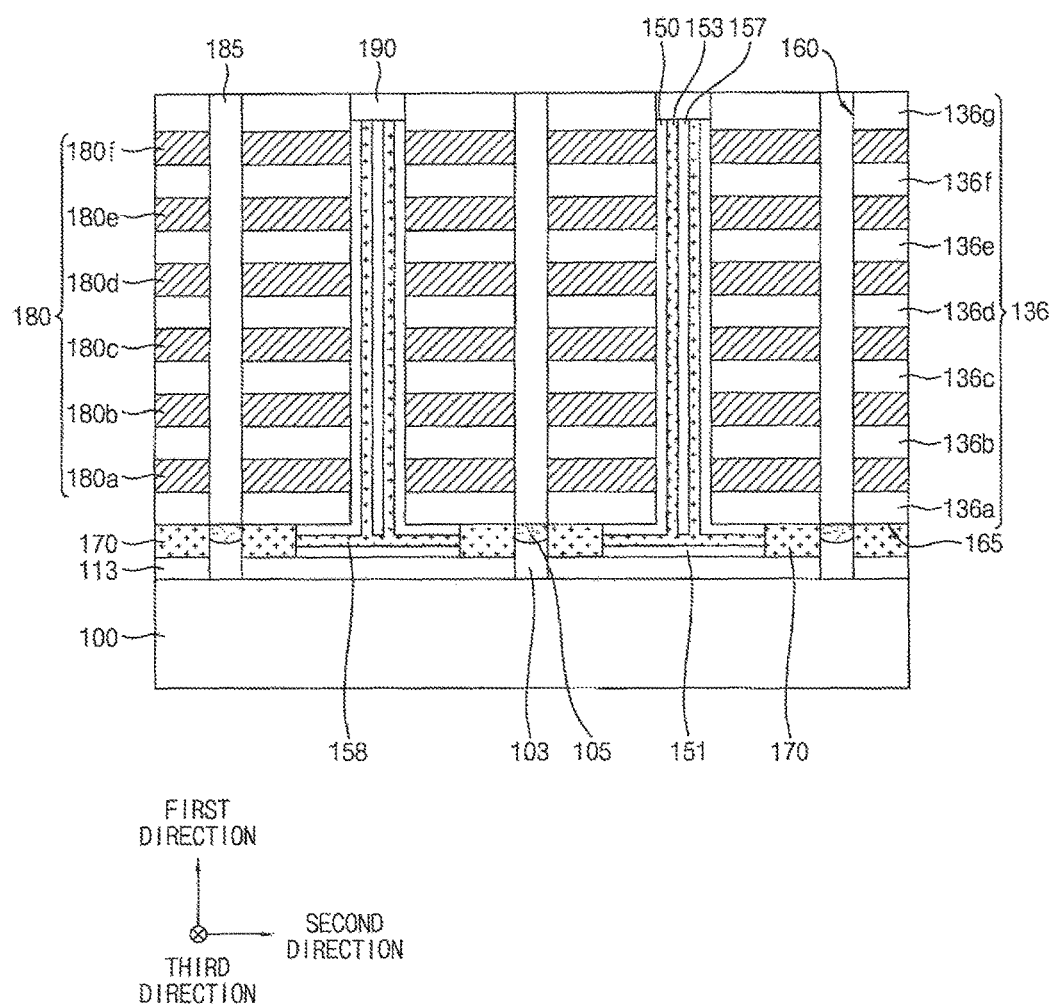
FIGS. 1 to 34 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe a relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional views of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a cross-sectional view illustrating a vertical memory device in accordance with example embodiments.

A direction substantially vertical to a top surface of a substrate is referred to as a first direction and two directions substantially parallel to the top surface of the substrate and substantially crossing each other are referred to as a second direction and a third direction. The first direction may be substantially perpendicular to the top surface of the substrate. For example, the second direction and the third direction are substantially perpendicular to each other. Additionally, a direction indicated by an arrow and a reverse direction thereof are considered as the same direction. The above mentioned definitions of the directions are the same throughout all the figures in this specification.

Referring to FIG. 1, the vertical memory device may include a lower insulation pattern 113 formed on a top surface of a substrate 100, a vertical channel structure including a channel 153, a dielectric layer structure 150 and a first filling pattern 157, and extending in the first direction on the lower insulation pattern 113, and gate lines 180 surrounding the vertical channel structure and spaced apart from each other along the first direction. A protrusion 158 diverged in the second direction may be formed at a lower portion of the channel 153, and the protrusions 158 neighboring in the second direction may be connected to the substrate 100 via semiconductor patterns 170 and 103.

The substrate 100 may include a semiconductor material, e.g., silicon and/or germanium. In example embodiments, the substrate 100 may include single crystalline silicon. For example, the substrate 100 may serve as a p-type well of the vertical memory device.

A plurality of the lower insulation patterns 113 may be arranged on the substrate 100 along the second direction by a predetermined distance. In example embodiments, the lower insulation pattern 113 may include a silicon oxide-based material.

The vertical channel structure including the channel 153, the dielectric layer structure 150 and the first filling pattern 157 may extend in the first direction from a top surface of the lower insulation pattern 113.

The channel 153 may have a hollow cylindrical shape or a cup shape. The channel 153 may include polysilicon or single crystalline silicon, and may include p-type impurities such as boron (B) in a portion thereof.

In example embodiments, the protrusion 158 expanded in a lateral direction, e.g., the second direction, may be formed at the lower portion of the channel 153. The protrusion 158 may be provided as an integral or unitary member with the channel 153, and may include a material substantially the same as that of the channel 153. For example, the protrusion 158 may have a ring shape or a plate shape surrounding the lower portion of the channel 153. As illustrated in FIG. 1, the protrusion 158 may extend in both lateral directions from the channel 153 in a vertical cross-sectional view.

The dielectric layer structure 150 may be formed on an outer sidewall of the channel 153, and may have a straw shape. In example embodiments, the dielectric layer structure may also include a protrusion diverged in the second direction according to a construction of the channel 153. A portion 151 of the dielectric layer structure 150 may be formed on the top surface of the lower insulation pattern 113 to be in contact with bottoms of the channel 153 and the protrusion 158.

The dielectric layer structure 150 may include a tunnel insulation layer, a charge storage layer and a blocking layer which may be sequentially stacked from the outer sidewall of the channel 153. The blocking layer may include silicon oxide or a metal oxide such as hafnium oxide or aluminum oxide. The charge storage layer may include a nitride such as silicon nitride or a metal oxide, and the tunnel insulation layer may include an oxide such as silicon oxide. For example, the dielectric layer structure 150 may have an oxide-nitride-oxide (ONO) layered structure.

The first filling pattern 157 may fill an inner space of the channel 153, and may have a solid cylindrical shape or a pillar shape. The first filling pattern 157 may include an insulation material such as silicon oxide. In some embodiments, the channel 153 may have a pillar shape or a solid cylindrical shape, and the first filling pattern 157 may be omitted.

In example embodiments, a horizontal semiconductor pattern 170 may be disposed on the top surface of the lower insulation pattern 113. The horizontal semiconductor pattern 170 may contact a sidewall of the protrusion 158. The horizontal semiconductor pattern 170 may include polysilicon or amorphous silicon. The horizontal semiconductor pattern 170 may also contact a sidewall of the protrusion of the dielectric layer structure 150. The horizontal semiconductor pattern 170 may be formed in a first gap 165.

As illustrated in FIG. 1, the horizontal semiconductor patterns 170 may be disposed on both lateral portions of one lower insulation layer pattern 113. In some embodiments, the horizontal semiconductor pattern 170 may extend in the third direction together with the lower insulation pattern 113.

The horizontal semiconductor patterns 170 may be spaced apart from each other along the second direction by the lower insulation patterns 113 neighboring in the second direction. In example embodiments, a vertical semiconductor pattern 103 may be formed between the lower insulation patterns 113 and between the horizontal semiconductor patterns 170.

The vertical semiconductor pattern 103 may protrude from the top surface of the substrate 100, and may be in contact with sidewalls of the neighboring horizontal semiconductor patterns 170. The vertical semiconductor pattern 103 may include single crystalline silicon or polysilicon. Thus, a connection between the substrate 100 serving as a body of the vertical memory device and the channel 153 may be realized through the protrusion 158 and the semiconductor patterns 170 and 103. The vertical semiconductor pattern 103 may extend linearly in the third direction.

In some embodiments, an impurity region 105 may be formed at an upper portion of the vertical semiconductor pattern 103. The impurity region 105 may include, e.g., n-type impurities. In some embodiments, the impurity region 105 may extend in the third direction, and may serve as a common source line (CSL) of the vertical memory device. In some embodiments, the impurity region 105 may have an island shape formed at a portion of the vertical semiconductor pattern 103 extending in the third direction.

In some embodiments, a pad 190 may be formed on the dielectric layer structure 150, the channel 153 and the first filling pattern 157. For example, upper portions of the dielectric layer structure 150, the channel 153 and the first filling pattern 157 may be capped by the pad 190.

The pad 190 may be electrically connected to, e.g., a bit line, and may serve as a source/drain region through which charges may be moved or transferred to the channel 153. The pad 190 may include polysilicon or single crystalline silicon, and may be optionally doped with n-type impurities such as phosphorus (P) or arsenic (As).

A plurality of the pads 190 may be arranged along the third direction such that a pad row may be defined, and a plurality of the pad rows may be arranged in the second direction. The vertical channel structure including the dielectric layer structure 150, the channel 153 and the first filling layer pattern 157 may be also arranged according to an arrangement of the pads 190. For example, a plurality of the vertical channel structures may be arranged along the third direction to form a channel row, and a plurality of the channel rows may be arranged in the second direction.

The gate lines 180 (e.g., 180a through 180f) may be formed on an outer sidewall of the dielectric layer structure 150, and may be spaced apart from each other along the first direction. In example embodiments, the gate lines 180 may partially surround the channels 153 or the vertical channel structures included in at least one channel row, and may extend in the third direction.

In some embodiments, widths or lengths of the gate lines 180 may be reduced along the first direction from the top surface of the substrate 100. For example, a plurality of the gate lines 180 may be stacked in a pyramidal shape or a stepped shape. Accordingly, the gate line 180 of each level may include a step portion protruding in the third direction from an upper gate line 180.

The gate lines 180 may include a ground selection line (GSL), a word line and a string selection line (SSL). For example, a lowermost gate line 180a may serve as the GSL. An uppermost gate line 180f may serve as the SSL. The gate lines 180b to 180e between the GSL and the SSL may serve as the word lines. However, the gate lines 180 may be formed at more numerous levels in consideration of a circuit design and a degree of integration of the vertical memory device, e.g. 16 levels, 24 levels, 32 levels, 48 levels, etc.

The gate line 180 may include a metal having a low electrical resistance or a nitride thereof. For example, the gate line 180 may include tungsten (W), tungsten nitride, titanium (Ti), titanium nitride, tantalum (Ta), tantalum nitride, platinum (Pt), and/or the like. However, the present inventive concept is not limited thereto. In example embodiments, the gate line 180 may have a multi-layered structure including a barrier layer formed of a metal nitride and a metal layer.

Insulating interlayer patterns 136 (e.g., 136a through 136g) may be disposed between the gate lines 180 neighboring in the first direction. In some embodiments, a lowermost insulating interlayer pattern 136a may be disposed on the protrusion of the dielectric layer structure 150 and the horizontal semiconductor pattern 170.

The insulating interlayer patterns 136 may include a silicon oxide-based material, e.g., silicon dioxide ($SiO_2$), silicon oxycarbide (SiOC) and/or silicon oxyfluoride (SiOF). The gate lines 180 may be insulated from each other by the insulating interlayer patterns 136 along the first direction. In example embodiments, the insulating interlayer patterns 136 may be stacked along the first direction in a pyramidal shape or a stepped shape substantially the same as or similar to that of the gate lines 180.

A second filling pattern 185 may be formed on the vertical semiconductor pattern 103 and/or the impurity region 105. The second filling pattern 185 may extend through the gate lines 180 and the insulating interlayer patterns 136 in the first direction. The second filling pattern 185 may have a fence shape extending in the third direction.

The second filling pattern 185 may substantially serve as a gate line cut pattern. Accordingly, a plurality of gate line structures may be defined by the second filling pattern 185. The gate line structure may include the gate lines 180 and the insulating interlayer patterns 136 cut by the second filling pattern 185, and may further include the channel rows surrounded by the gate lines 180 and the insulating interlayer patterns 136.

In some embodiments, a wiring structure may be disposed on an uppermost insulating interlayer pattern (e.g. 136g). The wiring structure may include the bit line electrically connected to the pad 190, and a gate line wiring electrically connected to the step portion of the gate line 180 at each level. In some embodiments, a contact connecting the step portion and the gate line wiring to each other may be further formed.

Figure 2:
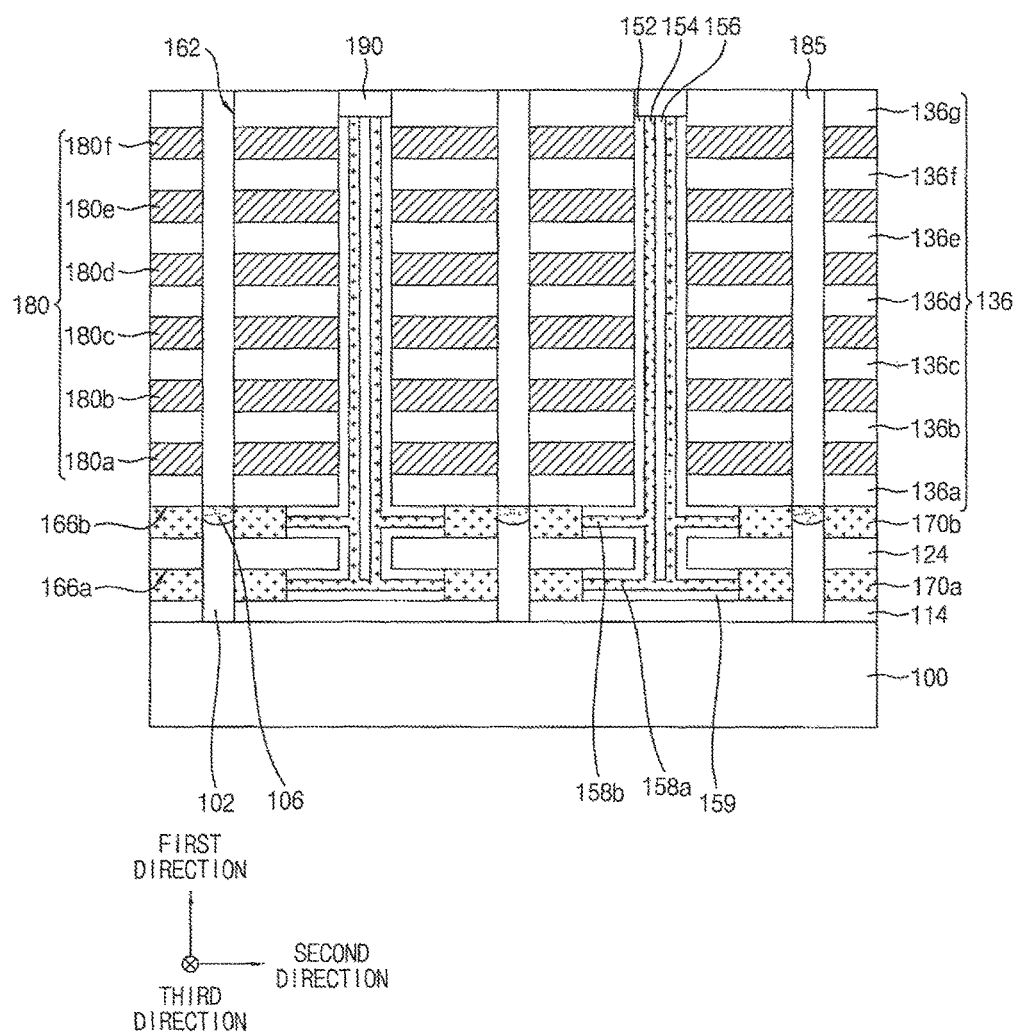

FIG. 2 is a cross-sectional view illustrating a vertical memory device in accordance with example embodiments. The vertical memory device of FIG. 2 may have elements and/or constructions substantially the same as or similar to those illustrated with reference to FIG. 1 except for a construction of a vertical channel structure. Thus, detailed descriptions on repeated elements and structures are omitted herein, and like reference numerals are used to designate like elements.

Referring to FIG. 2, the vertical channel structure may include a dielectric layer structure 152, a channel 154 and a first filling pattern 156.

The channel 154 may extend in the first direction from a top surface of a lower insulation pattern 114 formed on a substrate 100, and may extend through gate lines 180 and insulating interlayer patterns 136. The channel 154 may include a protrusion diverged in the second direction from a lower portion of the channel 154 as described with reference to FIG. 1. In example embodiments, the protrusion may have a multi-layered structure spaced apart from each other. In some embodiments, as illustrated in FIG. 2, the protrusion may include a first protrusion 158a and a second protrusion 158b.

The first protrusion 158a may be disposed on the lower insulation pattern 114, and may contact a sidewall of a first horizontal semiconductor pattern 170a. The second protrusion 158b may be disposed on a separation layer pattern 124, and may contact a sidewall of a second horizontal semiconductor pattern 170b.

The first protrusion 158a and the second protrusion 158b may be spaced apart from each other in the first direction by the separation layer pattern 124. The first horizontal semiconductor pattern 170a and the second horizontal semiconductor pattern 170b may be also spaced apart from each other in the first direction by the separation layer pattern 124. For example, the separation layer pattern 124 may be in contact with a top surface of the first horizontal semiconductor pattern 170a and a bottom of the second horizontal semiconductor pattern 170b. In some embodiments, the separation layer pattern 124 may include an insulation material such, for example, as a silicon oxide-based material.

The first horizontal semiconductor pattern 170a and the second horizontal semiconductor pattern 170b may be formed in a first lower gap 166a and a second lower gap 166b, respectively.

A vertical semiconductor pattern 102 may protrude from a top surface of the substrate 100 between the lower insulation patterns 114 neighboring in the second direction. The vertical semiconductor pattern 102 may contact sidewalls of the first and second horizontal semiconductor patterns 170a and 170b. The vertical semiconductor pattern 102 may also contact a sidewall of the separation layer pattern 124.

An impurity region 106 may be formed at an upper portion of the vertical semiconductor pattern 102. In some embodiments, the impurity region 106 may contact sidewalls of two second horizontal semiconductor patterns 170b neighboring in the second direction.

The dielectric layer structure 152 may be formed on an outer sidewall of the channel 154. A portion 159 of the dielectric layer structure 152 may be formed on a top surface of the lower insulation pattern 114, and may be in contact with a bottom of the first protrusion 158a. A portion of the dielectric layer structure 152 may surround the lower portion of the channel 154, and may partially surround a lateral portion of the separation layer pattern 124. The lower portion of the channel 154 may extend through the separation layer pattern 124.

According to example embodiments as described above, the channel 154 may be connected to the substrate 100 through the first and second protrusions 158a and 158b, the horizontal semiconductor patterns 170a and 170b, and the vertical semiconductor pattern 102.

In some embodiments, the second protrusion 158b may be connected to the impurity region 106 serving as a CSL through the second horizontal semiconductor pattern 170b. Thus, an electron transfer path may be achieved through the second protrusion 158a. The first protrusion 158a may be connected to the substrate 100 through the first horizontal semiconductor pattern 170a and the vertical semiconductor pattern 102 so that a hole transfer path may be provided.

As described above, the protrusions 158a/158b may be designed as a multi-layered structure so that the electron transfer path and the hole transfer path may be separated from each other. Thus, an operational reliability of the vertical memory device may be further improved.

FIGS. 3 to 15 are cross-sectional views illustrating methods of manufacturing a vertical memory device in accordance with example embodiments. For example, FIGS. 3 to 15 illustrate a method of manufacturing the vertical memory device of FIG. 1.

Figure 3:
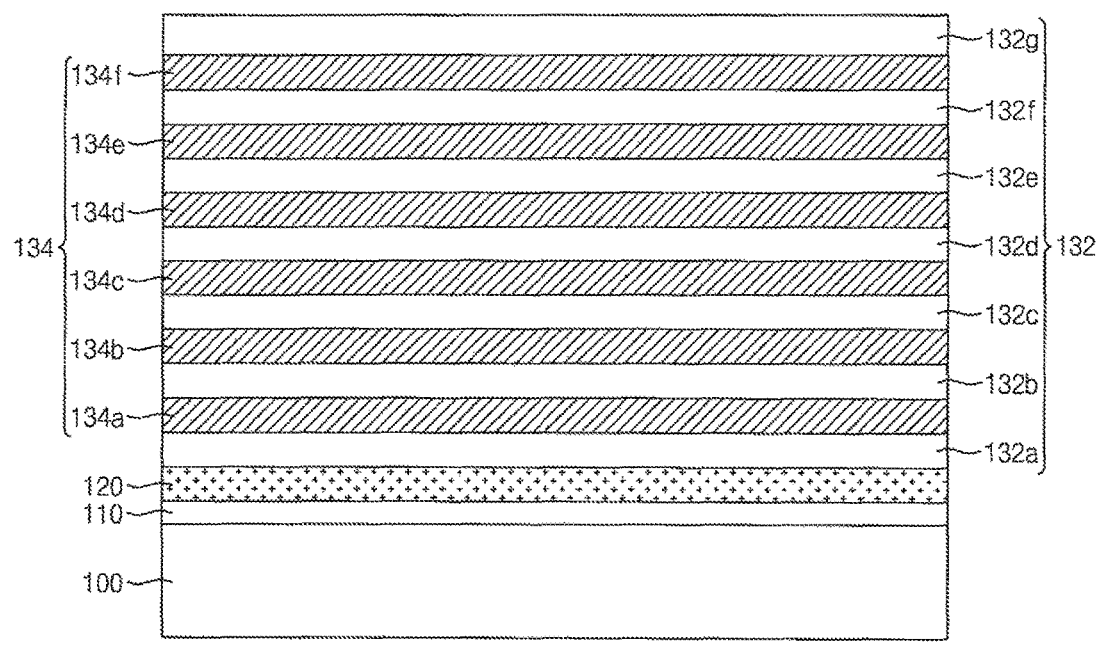
Figure 3:
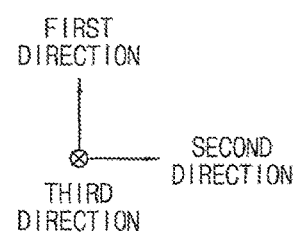

Referring to FIG. 3, a lower insulation layer 110 and a lower sacrificial layer 120 may be formed on a substrate 100, and insulating interlayers 132 (e.g., 132a through 132g) and sacrificial layers 134 (e.g. 134a through 134f) may be alternately and repeatedly formed on the lower sacrificial layer 120.

In example embodiments, a semiconductor substrate including, e.g., single crystalline silicon or germanium may be used as the substrate 100. The lower insulation layer 110 may be formed of, e.g., a silicon-oxide based material. The lower sacrificial layer 120 may be formed of a silicon (Si) compound such as polysilicon or amorphous silicon.

The insulating interlayers 132 may be formed of an oxide-based material, e.g., silicon dioxide, silicon oxycarbide and/or silicon oxyfluoride. The sacrificial layers 134 may be formed of a material that may have an etching selectivity with respect to the insulating interlayers 132 and may be easily removed by a wet etching process. For example, the sacrificial layers 134 may be formed of a nitride-based material, e.g., silicon nitride and/or silicon boronitride. A mold structure may be defined by the insulating interlayers 132 and the sacrificial layers 134 alternately and repeatedly formed on the lower sacrificial layer 120.

The lower insulation layer 110, the lower sacrificial layer 120, the insulating interlayers 132 and the sacrificial layers 134 may be formed by at least one of a chemical vapor deposition (CVD) process, a plasma enhanced chemical vapor deposition (PECVD) process, a high density plasma chemical vapor deposition (HDP-CVD) process, an atomic layer deposition (ALD) process and a sputtering process. In some embodiments, the lower insulation layer 110 may be formed by a thermal oxidation process on a top surface of the substrate 100.

Figure 4:
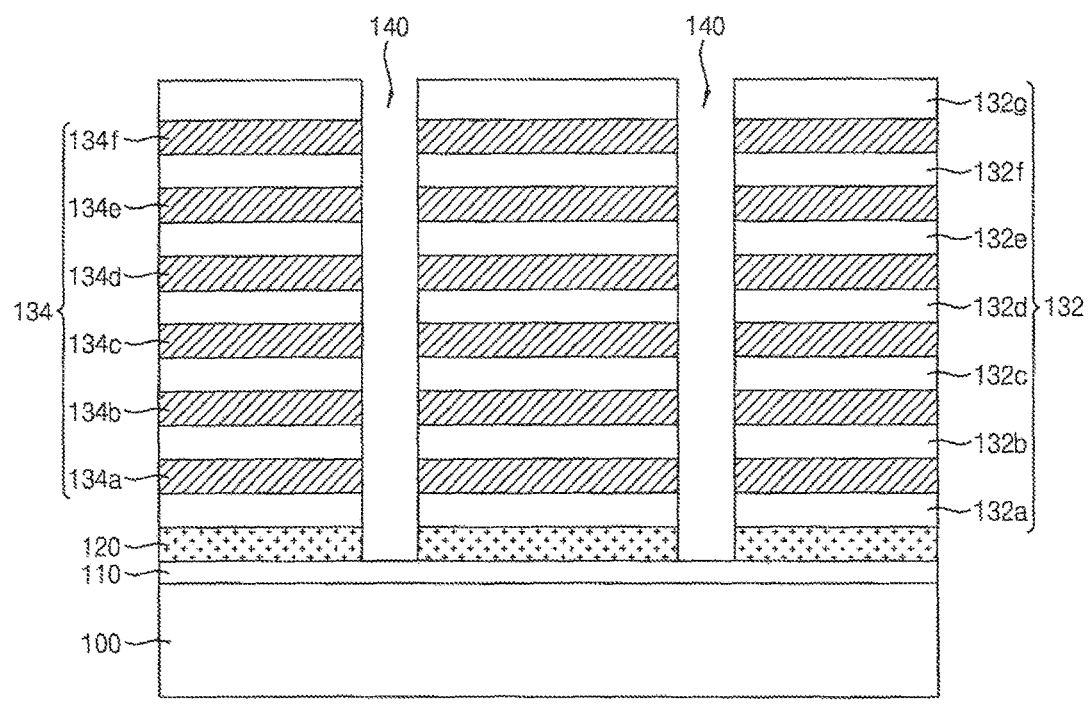
Figure 4:
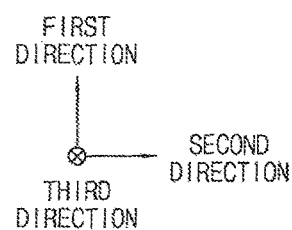

Referring to FIG. 4, a channel hole 140 may be formed through the mold structure and the lower sacrificial layer 120.

In example embodiments, a hard mask (not illustrated) may be formed on an uppermost insulating interlayer (e.g.

132g). The insulating interlayers 132 and the sacrificial layers 134 may be partially etched by performing, e.g., a dry etching process, and the lower sacrificial layer 120 may be further etched to form the channel hole 140. The hard mask may be used as an etching mask to form the channel hole 140. The channel hole 140 may extend in the first direction, and a top surface of the lower insulation layer 110 may be exposed through the channel hole 140.

The hard mask may be formed of, e.g., silicon-based or carbon-based spin-on hardmask (SOH) materials, and/or a photoresist material. The hard mask may be removed by an ashing process and/or a strip process after the formation of the channel holes 140.

A plurality of the channel holes 140 may be formed along the third direction to form a channel hole row, and a plurality of the channel hole rows may be formed along the second direction.

Figure 5:
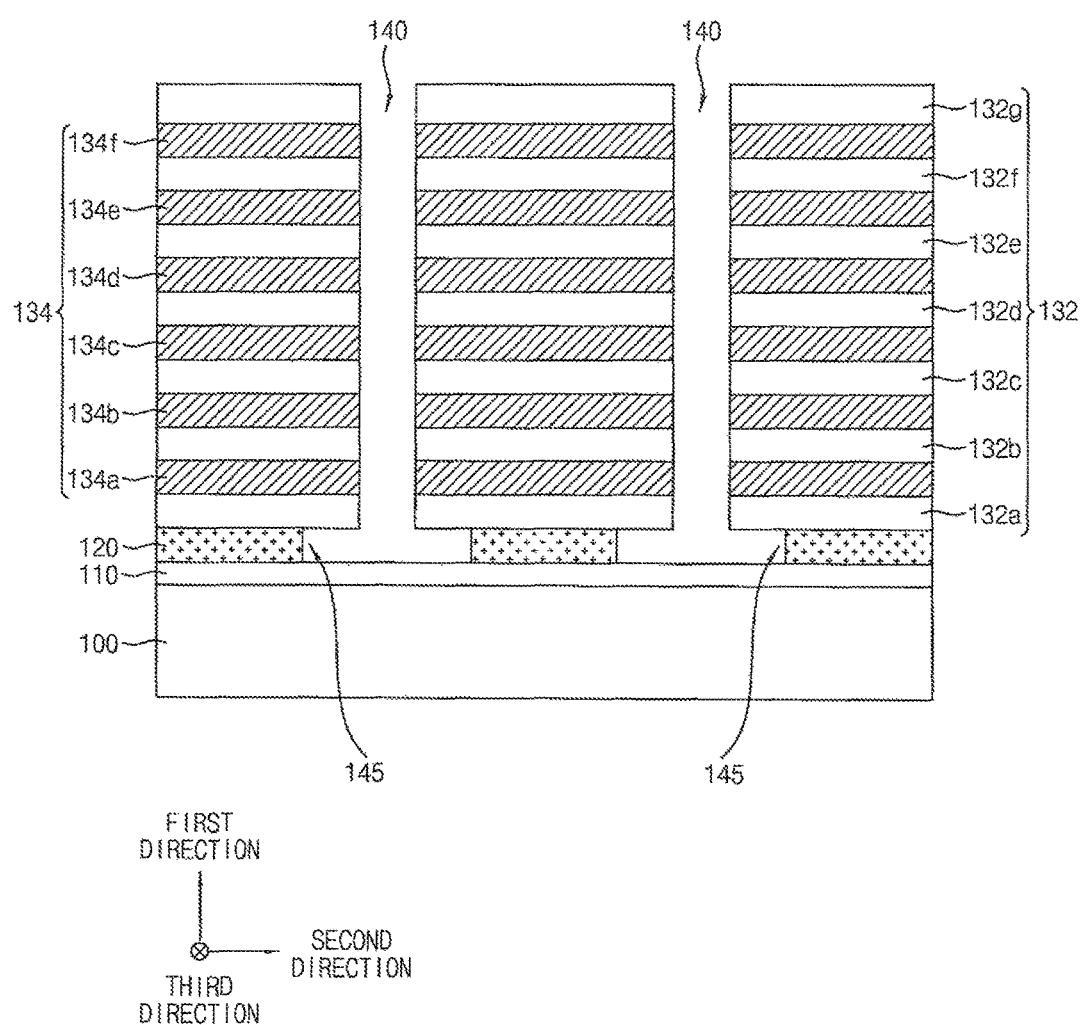

Referring to FIG. 5, the lower sacrificial layer 120 exposed from a lower portion of the channel hole 140 may be partially etched to form a recess 145.

In example embodiments, the etching process for the lower sacrificial layer 120 may include a gas phase etching (GPE) process using, e.g., a chlorine ($Cl_2$) gas. The chlorine gas may be introduced through the channel hole 140 so that a portion of the lower sacrificial layer 120 exposed by the lower portion of the channel hole 140 may be removed.

In some embodiments, the recess 145 may be expanded radially from the lower portion of the channel hole 140. A remaining portion of the lower sacrificial layer 120 on the lower insulation layer 120 may serve as a supporting pattern for the mold structure.

Figure 6:
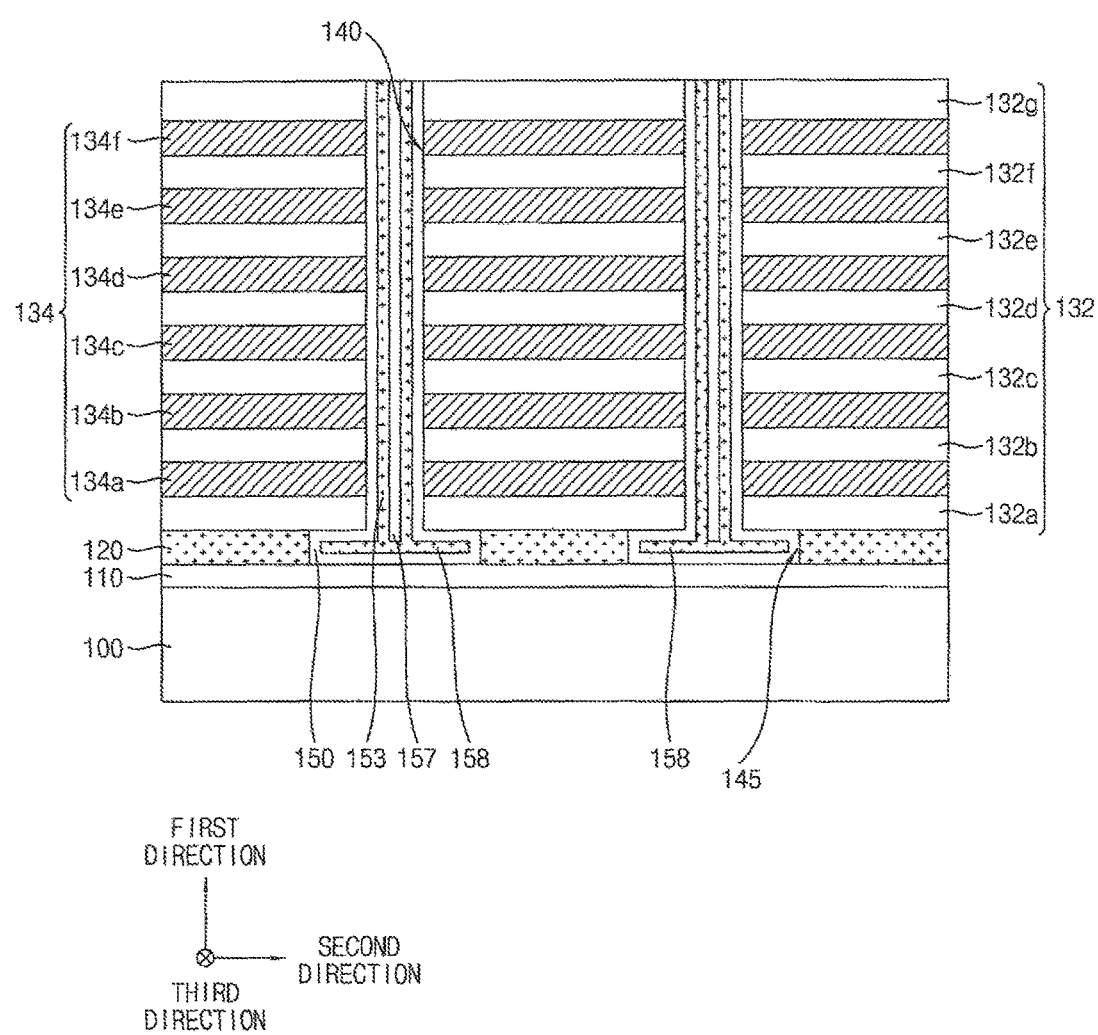

Referring to FIG. 6, a dielectric layer structure 150, a channel 153 and a first filling pattern 157 may be formed in the channel hole 140 and the recess 145.

In example embodiments, a dielectric layer, a channel layer and a first filling layer may be sequentially formed along a top surface of the uppermost insulating interlayer 132g, and inner walls of the channel hole 140 and the recess 145. Upper portions of the dielectric layer, the channel layer and the first filling layer may be planarized by a chemical mechanical planarization (CMP) process until the top surface of the insulating interlayer 132g may be exposed. Accordingly, the dielectric structure 150, the channel 153 and the first filling pattern 157 filling the channel hole 140 and the recess 145 may be obtained.

The dielectric layer may be formed by sequentially forming a blocking layer, a charge storage layer and a tunnel insulation layer. For example, the blocking layer may be formed using an oxide, e.g., silicon oxide, the charge storage layer may be formed using silicon nitride or a meal oxide, and the tunnel insulation layer may be formed using an oxide, e.g., silicon oxide. In some embodiments, the dielectric layer may be formed as an oxide-nitride-oxide (ONO) layered structure. The blocking layer, the charge storage layer and the tunnel insulation layer may be formed by a CVD process, a PECVD process, an ALD process, etc.

The channel layer may be formed of polysilicon or amorphous silicon which is optionally doped with impurities. In some embodiments, a heat treatment or a laser beam irradiation may be further performed on the channel layer. In this case, the channel layer may be transformed to include single crystalline silicon. The first filling layer may be formed using an insulation material, e.g., silicon oxide or silicon nitride. The channel layer and the first filling layer may be formed by a CVD process, a PECVD process, an ALD process, a physical vapor deposition (PVD) process, a sputtering process, etc.

In some embodiments, the dielectric layer structure 150 may substantially fully cover the inner walls of the channel hole 140 and the recess 145. The channel 153 may be formed on an inner wall of the dielectric layer structure 150 to sufficiently fill the recess 145 and partially fill the channel hole 140. The first filling pattern 157 may fill a remaining portion of the channel hole 140.

In example embodiments, a portion of the channel 153 formed in the recess 145 may be defined as a protrusion 158. The protrusion 158 may be integral with the channel 153, and may be expanded in the second direction.

In some embodiments, the channel 153 may completely fill the channel hole 140, and the formation of the first filling pattern 157 may be omitted.

After performing the above-mentioned processes, a vertical channel structure including the dielectric layer structure 150, the channel 153 and the first filling layer pattern 157 sequentially formed on a sidewall of the channel hole 140 may be defined in each channel hole 140. According to the arrangement of the channel holes 140 as described above, a plurality of the vertical channel structures may be arranged along the third direction to define a channel row, and a plurality of the channel rows may be arranged along the second direction.

Figure 7:
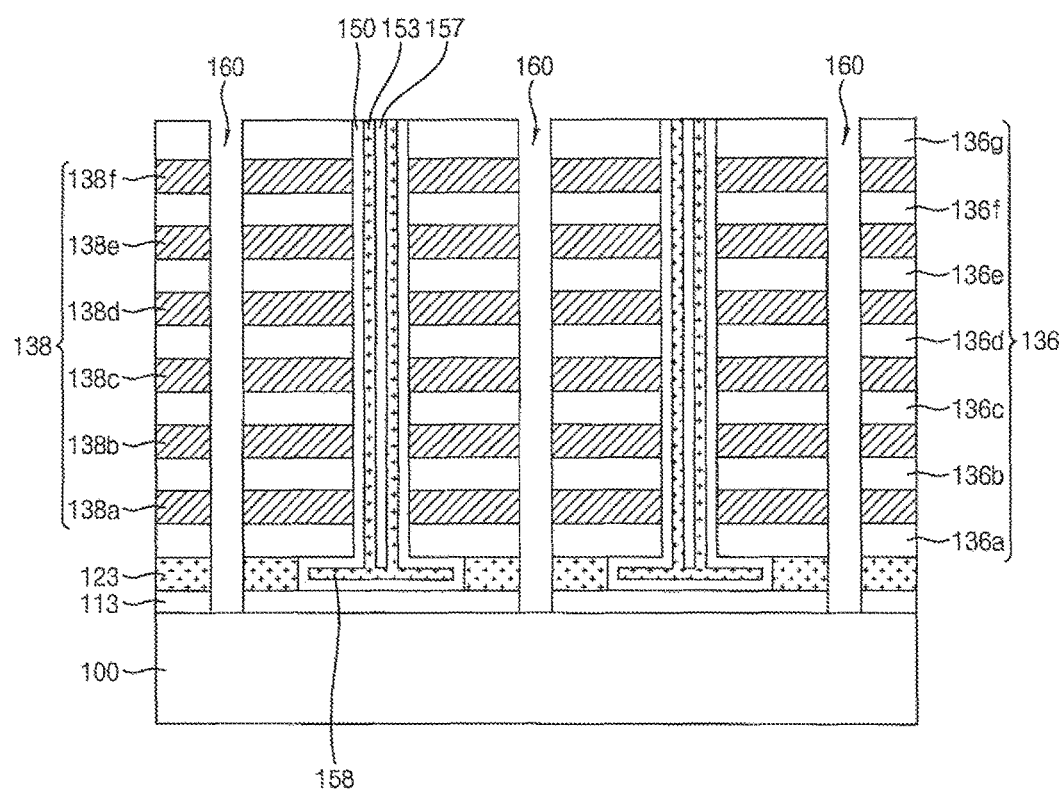
Figure 7:
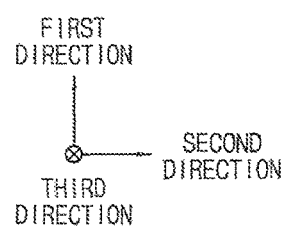

Referring to FIG. 7, an opening 160 may be formed through the mold structure, the lower sacrificial layer 120 and the lower insulation layer 110.

For example, a hard mask (not illustrated) partially exposing the uppermost insulating interlayer 132g between some of the channel rows may be formed on the uppermost insulating interlayer 132g. The insulating interlayers 132, the sacrificial layers 134, the lower sacrificial layer 120 and the lower insulation layer 110 may be partially etched by, e.g., a dry etching process using the hard mask as an etching mask to form the opening 160. The hard mask may be formed using a photoresist material or an SOH material. The hard mask may be removed by an ashing process and/or a strip process after the formation of the opening 160.

In example embodiments, the opening 160 may extend in the third direction, and a plurality of the openings 160 may be formed along the second direction. A top surface of the substrate 100 may be exposed through the opening 160.

The predetermined number of the channel rows may be included between the openings 160 neighboring in the second direction. The mold structure may be divided into a plurality of structures by the openings 160.

As illustrated in FIG. 7, after the formation of the opening 160, the insulating interlayers 132 and the sacrificial layers 134 may be changed into insulating interlayer patterns 136 (e.g., 136a through 136g) and sacrificial patterns 138 (e.g., 138a through 138f). Further, the lower sacrificial layer 120 and the lower insulation layer 110 may be separated into a plurality of lower sacrificial patterns 123 and a plurality of lower insulation patterns 113.

The insulating interlayer pattern 136 and the sacrificial pattern 138 at each level may have a plate shape surrounding the channel row and extending, in the third direction. The lower sacrificial pattern 123 may surround the protrusion 158 included in the channel row and may also extend in the third direction. The lower insulation pattern 113 may extend in the third direction, and may serve as a supporter for the channel row, the lower sacrificial pattern 123 and the mold structure separated by the opening 160.

Figure 8:
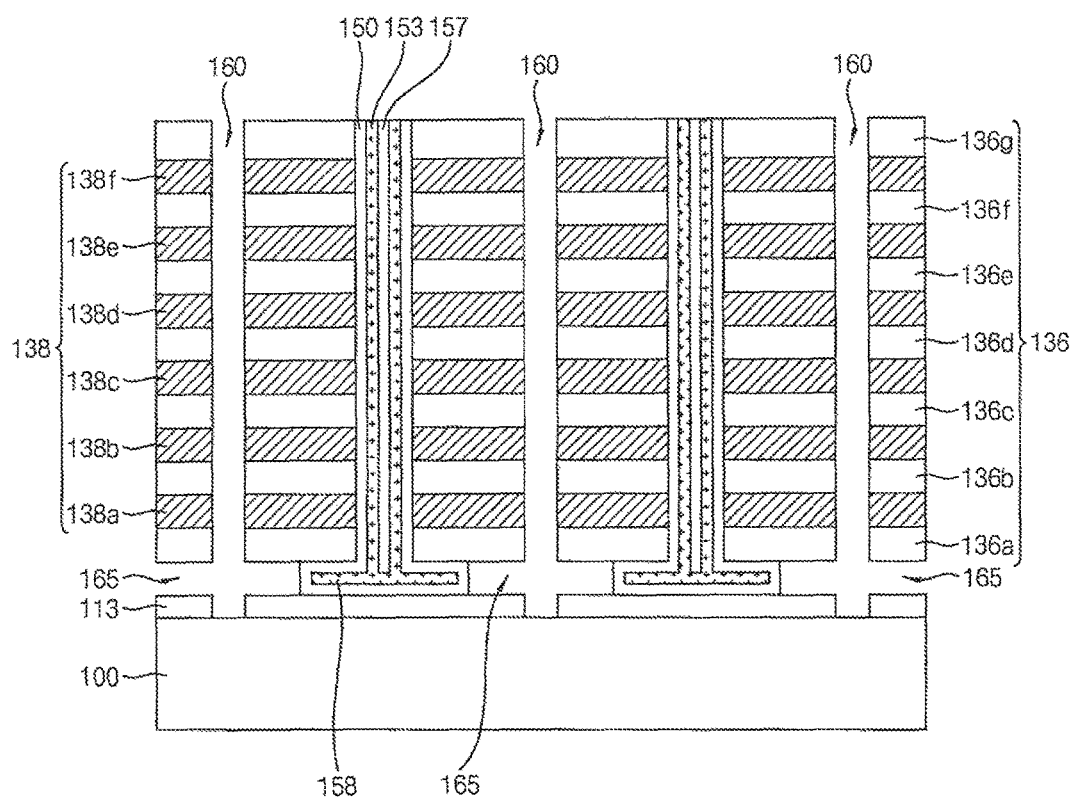

Referring to FIG. 8, the lower sacrificial pattern 123 exposed by the opening 160 may be removed.

In example embodiments, the lower sacrificial pattern 123 may be selectively removed by a GPE process using, e.g., a chlorine gas as a reactive gas. A space from which the lower sacrificial pattern 123 is removed may be defined as a first gap 165. A portion of the dielectric layer structure 150 formed on the inner wall of the recess 145 (FIG. 6) may be exposed by the first gap 165.

Figure 9:
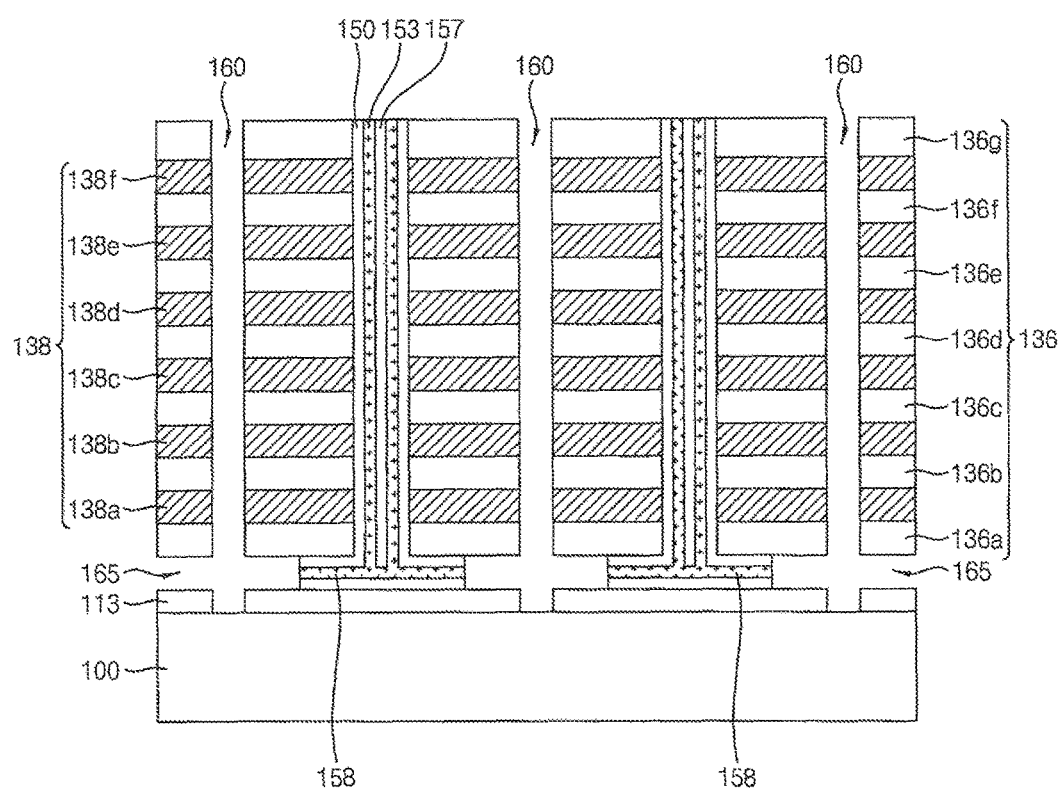

Referring to FIG. 9, the portion of the dielectric layer structure 150 exposed by the first gap 165 may be removed. In example embodiments, an etchant solution including, e.g., an acid solution and/or a hydroxide solution may be provided through the opening 160 and the first gap 165 to partially remove the portion of the dielectric layer structure 150.

In example embodiments, after etching the dielectric layer structure 150 in the first gap 165, a sidewall of the protrusion 158 may be exposed through the first gap 165.

Figure 10:
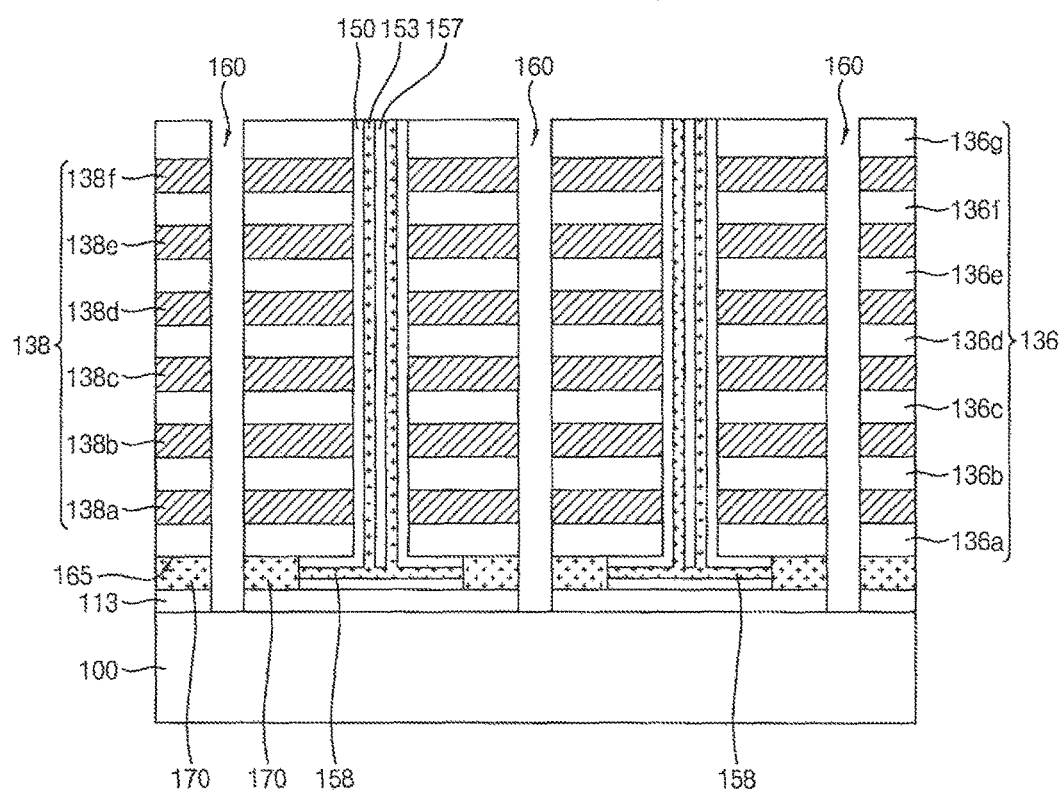

Referring to FIG. 10, a horizontal semiconductor pattern 170 filling the first gap 165 and contacting the exposed sidewall of the protrusion 158 may be formed.

In example embodiments, a semiconductor layer sufficiently filling the first gap 165 and at least partially filling the opening 160 may be formed. A portion of the semiconductor layer formed in the opening 160 may be etched to form the horizontal semiconductor pattern 170 filling the first gap 165. The semiconductor layer may be formed of polysilicon or amorphous silicon by, e.g., a sputtering process or an ALD process.

The horizontal semiconductor pattern 170 may contact the sidewall of the protrusion 158 of the channel 153, and may extend in the third direction. The horizontal semiconductor pattern 170 may contact a plurality of the protrusions 158 included in the channel row. The horizontal semiconductor patterns 170 neighboring in the second direction may be physically separated by the opening 160.

Figure 11:
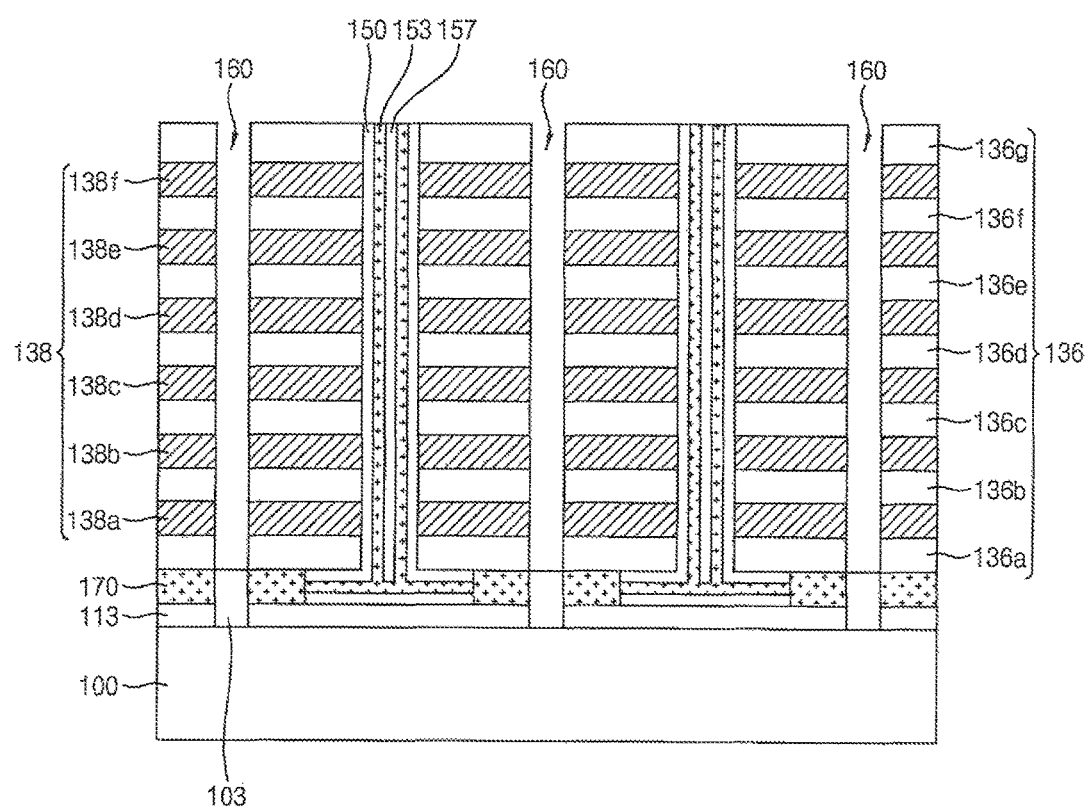

Referring to FIG. 11, a vertical semiconductor pattern 103 may be formed at a lower portion of the opening 160.

In example embodiments, the vertical semiconductor pattern 103 may be formed by a selective epitaxial growth (SEG) process using the top surface of the substrate 100 exposed through the opening 160 as a seed. The vertical semiconductor pattern 103 may include polysilicon or single crystalline silicon. Alternatively, an amorphous silicon layer filling the lower portion of the opening 160 may be formed, and then a laser epitaxial growth (LEG) process or a solid phase epitaxi (SPE) process may be performed on the amorphous silicon layer to form the vertical semiconductor pattern 103.

The vertical semiconductor pattern 103 may extend linearly in the third direction. The vertical semiconductor pattern 103 may fill a space between the lower insulation patterns 113 neighboring each other and between the horizontal semiconductor patterns 170 neighboring each other, and may protrude in the first direction from the top surface of the substrate 100. The neighboring horizontal semiconductor patterns 170 may contact the vertical semiconductor pattern 103. Accordingly, a connection between the channel 153 and the substrate 100 may be realized by a connecting semiconductor structure including the protrusion 158, the horizontal semiconductor pattern 170 and the vertical semiconductor pattern 103.

In some embodiments, top surfaces of the vertical semiconductor pattern 103 and the horizontal semiconductor pattern 170 may be coplanar with each other. In some embodiments, the top surface of the vertical semiconductor pattern 103 may be positioned between the top surface of the horizontal semiconductor pattern 170 and a top surface of a lowermost insulating interlayer pattern 136a.

Figure 12:
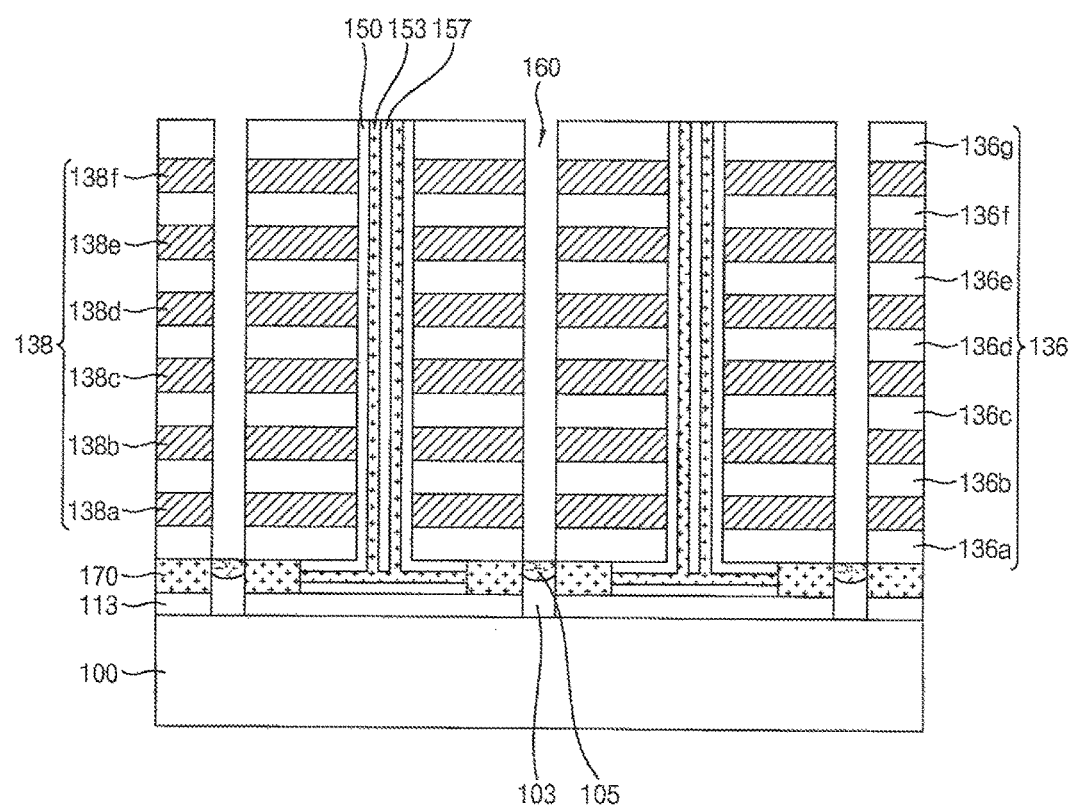
Figure 12:
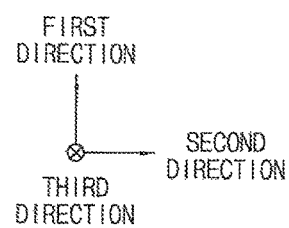

Referring to FIG. 12, for example, n-type impurities may be implanted through the opening 160 to form an impurity region 105 at an upper portion of the vertical semiconductor pattern 103.

In some embodiments, the impurity region 105 may extend in the third direction, and may serve as a CSL of the vertical memory device. The impurity region 105 may contact two horizontal semiconductor patterns 170 neighboring each other.

In some embodiments, the impurity region 105 may have an island shape formed at a specific area of the upper portion of the vertical semiconductor pattern 103.

Figure 13:
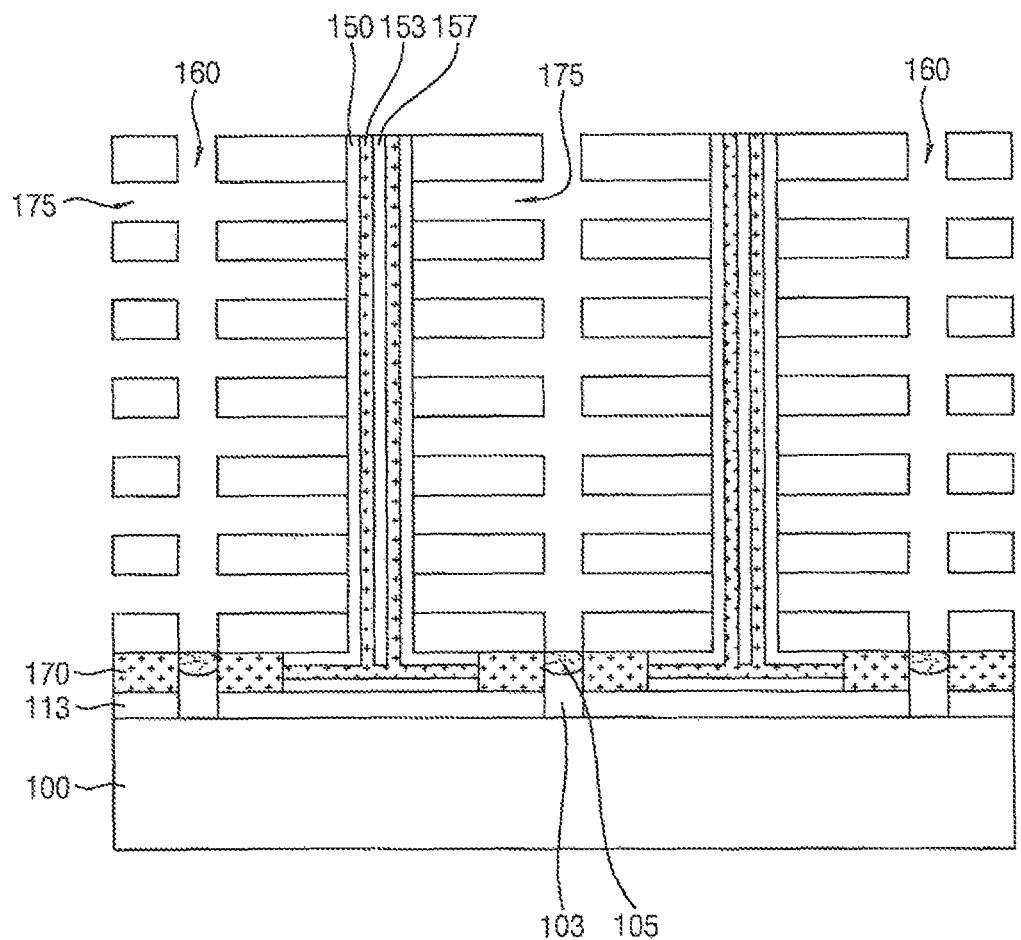
Figure 13:
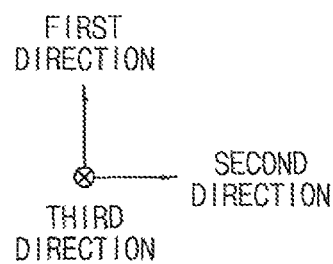

Referring to FIG. 13, the sacrificial patterns 138, the sidewalls of which are exposed by the opening 160 may be removed. In example embodiments, the sacrificial patterns 138 may be removed by a wet etching process using, e.g., phosphoric acid and/or sulfuric acid as an etchant solution.

A second gap 175 may be defined by a space from which the sacrificial pattern 138 is removed. A plurality of the second gaps 175 may be formed along the first direction. An outer sidewall of the dielectric layer structure 150 may be partially exposed by the second gap 175.

Figure 14:
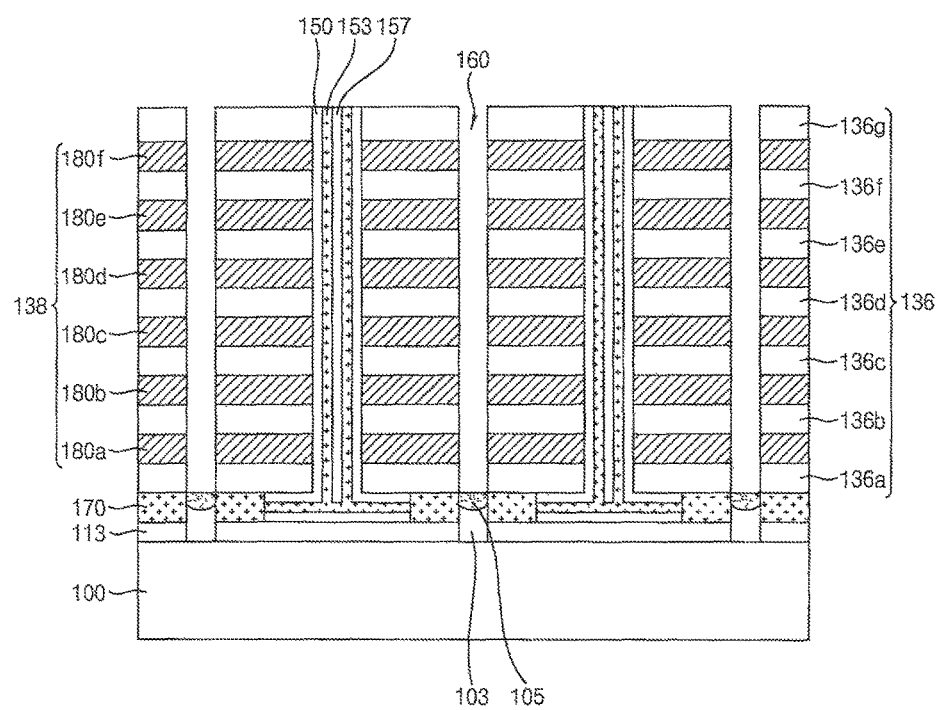

Referring to FIG. 14, gate lines 180 (e.g., 180a through 180f) may be formed in the second gaps 175. Accordingly, the sacrificial layer 134 or the sacrificial pattern 138 of each level may be replaced with the gate line 180.

In example embodiments, a gate electrode layer may be formed on the exposed outer sidewalls of the dielectric layer structures 150, surfaces of the insulating interlayer patterns 136, and top surfaces of the vertical semiconductor pattern 103 and the vertical channel structure. The gate electrode layer may sufficiently fill the second gaps 175 and at least partially fill the opening 160.

The gate electrode layer may be formed using a metal and/or a metal nitride. For example, the gate electrode layer may be formed of tungsten, tungsten nitride, titanium, titanium nitride, tantalum, tantalum nitride, platinum, etc. In some embodiments, the gate electrode layer may be formed as a multi-layered structure including a barrier layer formed of a metal nitride, and a metal layer. The gate electrode layer may be formed by a CVD process, a PECVD process, an ALD process, a PVD process, a sputtering process, etc.

In some embodiments, an additional blocking layer may be formed along inner walls of the second gaps 175 and surfaces of the insulating interlayer patterns 136 prior to the formation of the gate electrode layer. The additional blocking layer may be formed of silicon oxide or a metal oxide.

Subsequently, the gate electrode layer may be partially removed to form the gate line 180 in the second gap 175 at each level.

For example, an upper portion of the gate electrode layer may be planarized by a CMP process until an uppermost insulating interlayer pattern 136g may be exposed. Portions of the gate electrode layer formed in the opening 160 and on the top surface of the vertical semiconductor pattern 103 may be etched to obtain the gate lines 180. The gate electrode layer may be partially etched by a wet etching process using, e.g., a hydrogen peroxide-containing solution.

The gate lines 180 may include a GSL, word lines and an SSL sequentially stacked and spaced apart from one another in the first direction. For example, a lowermost gate line (e.g. 180a) may serve as the GSL. An uppermost gate line (e.g. 180f) may serve as the SSL. The gate lines 180b through 180e between the GSL and the SSL may serve as the word lines. The stacked number of the GSL, the word lines and the SSL may be adjusted in consideration of a degree of integration of the vertical memory device.

The gate line 180 at each level may surround the predetermined number of the channel rows. Accordingly, a gate line structure may be defined by the channel rows, and the gate lines 180 and the insulating interlayer patterns 136 that that are repeatedly stacked in the first direction and surround the predetermined number of the channel rows. A plurality of the gate line structures may be defined by the opening 160, and may be arranged along the second direction.

Figure 15:
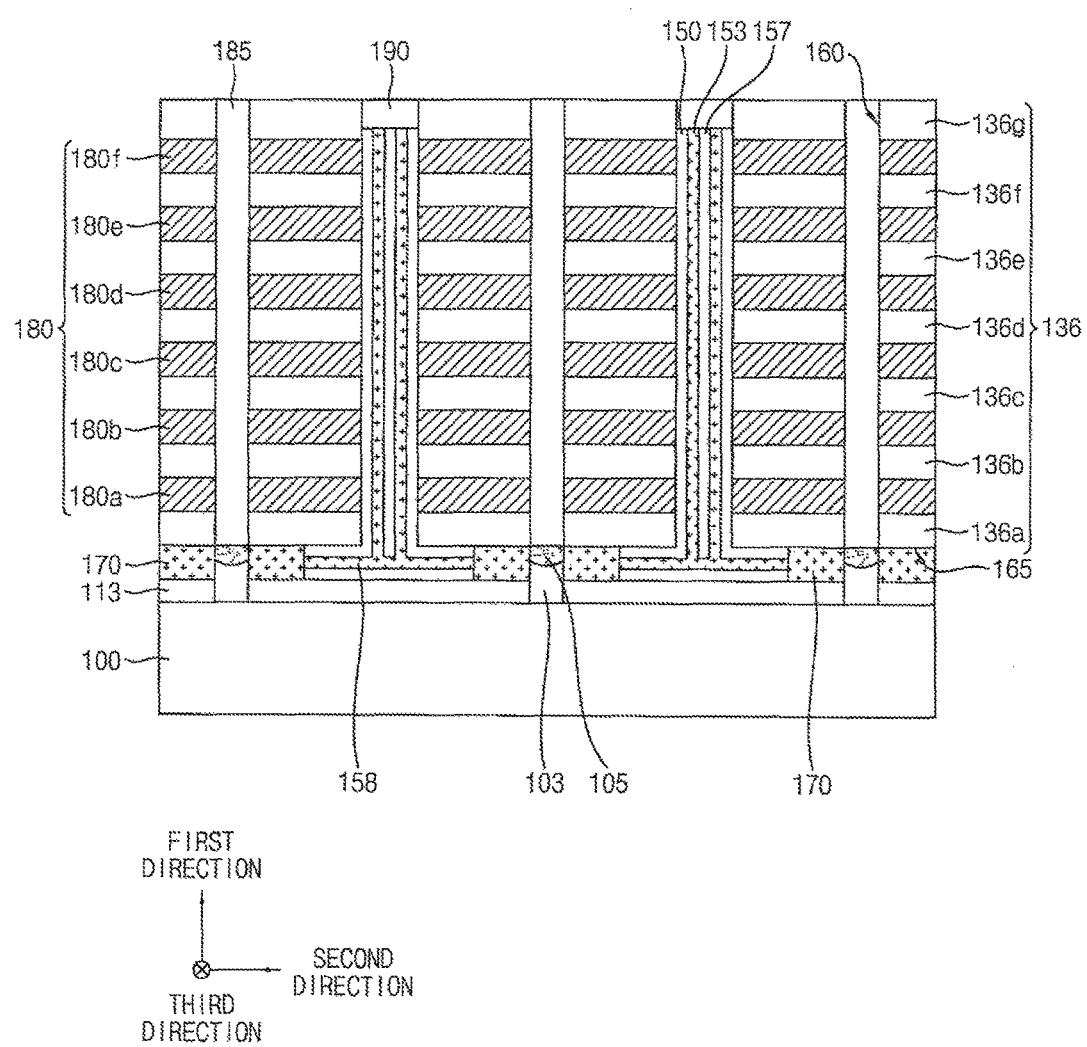

Referring to FIG. 15, a second filling pattern 185 may be formed in the opening 160.

For example, a second filling layer sufficiently filling the openings 160 may be formed on the uppermost insulating interlayer pattern 136g and the vertical semiconductor pattern 103. An upper portion of the second filling layer may be planarized by a CMP process and/or an etch-back process until the uppermost insulating interlayer pattern 136g is exposed to form the second filling pattern 185. The second filling layer may be formed of an insulation material such as, for example, silicon oxide.

The second filling pattern 185 may have a fence shape extending in the third direction. The second filling pattern 185 may serve as a gate line cut pattern.

In some embodiments, a pad 190 capping an upper portions of the vertical channel structure may be further formed. For example, upper portions of the dielectric layer structure 150, the channel 153 and the first filling pattern 157 may be partially removed by, e.g., an etch-back process to form a concave portion. A pad layer may be formed on the dielectric layer structure 150, the channel 153, the first filling pattern 157 and the uppermost insulating interlayer pattern 136g to sufficiently fill the concave portion. An upper portion of the pad layer may be planarized by e.g., a CMP process until a top surface of the uppermost insulating interlayer pattern 136g may be exposed to form the pad 190. The pad layer may be formed using polysilicon optionally doped with n-type impurities.

In some embodiments, the pad 190 may be formed after the formation of the vertical channel structure as illustrated in FIG. 6, and before the formation of the opening 160 as illustrated in FIG. 7.

A wiring structure including a bit line electrically connected to the pad 190, and a gate line wiring electrically connected to the gate line 180 at each level may be further formed.

According to example embodiments as described above, the protrusion 158 diverged from the lower portion of the channel 153 may be formed, and the horizontal semiconductor pattern 170 contacting the protrusion 158 may be formed. The vertical semiconductor pattern 103 may be grown from the substrate 100 to be in contact with the horizontal semiconductor pattern 170. Therefore, the channel 153 and the substrate 100 may be connected to each other.

In a comparative example, a portion of the dielectric layer structure 150 formed on a bottom of the channel hole 140 may be removed by an etch-back process in order to achieve a connection between the substrate 100 and the channel 153. However, as an aspect ratio of the channel hole 140 increases or the stacked number of the gate lines 180 increases, the etch-back process may not be easily performed. Further, a sidewall of the channel hole 140 may be damaged by the etch-back process to deteriorate reliability of a whole manufacturing process.

However, according to example embodiments, the etch-back process for the dielectric layer structure 150 may be omitted, and the channel 153 may be connected to the substrate 100 through a lateral portion thereof. Therefore, defects generated from the etch-back process of the comparative example may be avoided so that process reliability may be improved.

FIGS. 16 to 20 are cross-sectional views illustrating methods of manufacturing a vertical memory device in accordance with some example embodiments. Detailed descriptions on processes substantially the same as or similar to those illustrated with reference to FIGS. 3 to 15 may be omitted.

Figure 16:
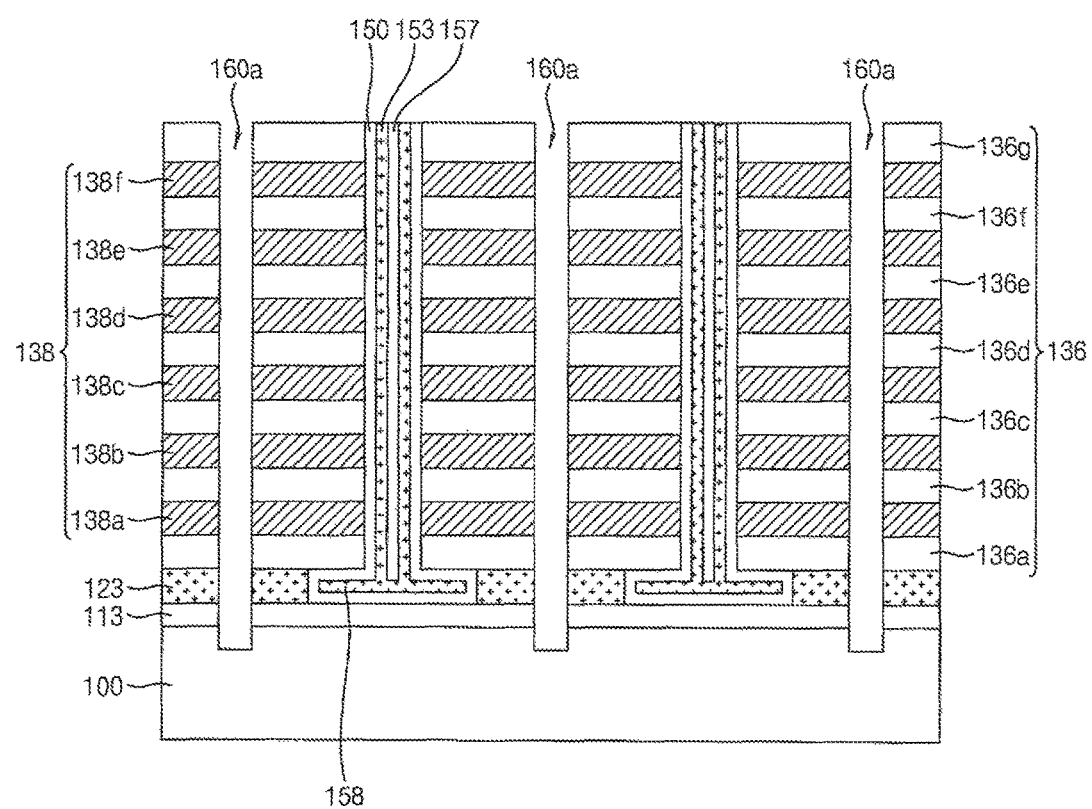
Figure 16:
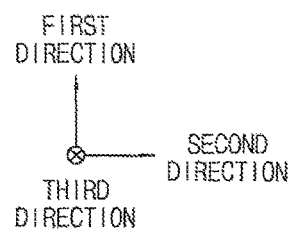

Referring to FIG. 16, processes substantially the same as or similar to those illustrated with reference to FIGS. 3 to 7 may be performed.

Accordingly, lower insulation patterns 113 and lower sacrificial patterns 123 separated by openings 160a may be formed. A mold structure including insulating interlayer patterns 136 and sacrificial patterns 138 alternately stacked may be formed on the lower sacrificial patterns 123. A vertical channel structure including a dielectric layer structure 150, a channel 153 and a first filling pattern 157 may be formed through the mold structure. The dielectric layer structure 150 and the channel 153 may be diverged in the second direction at a lower portion of the vertical channel structure. Accordingly, the channel 153 may include a protrusion 158 extending in the second direction.

In example embodiments, the opening 160a may extend to an upper portion of the substrate 100.

Figure 17:
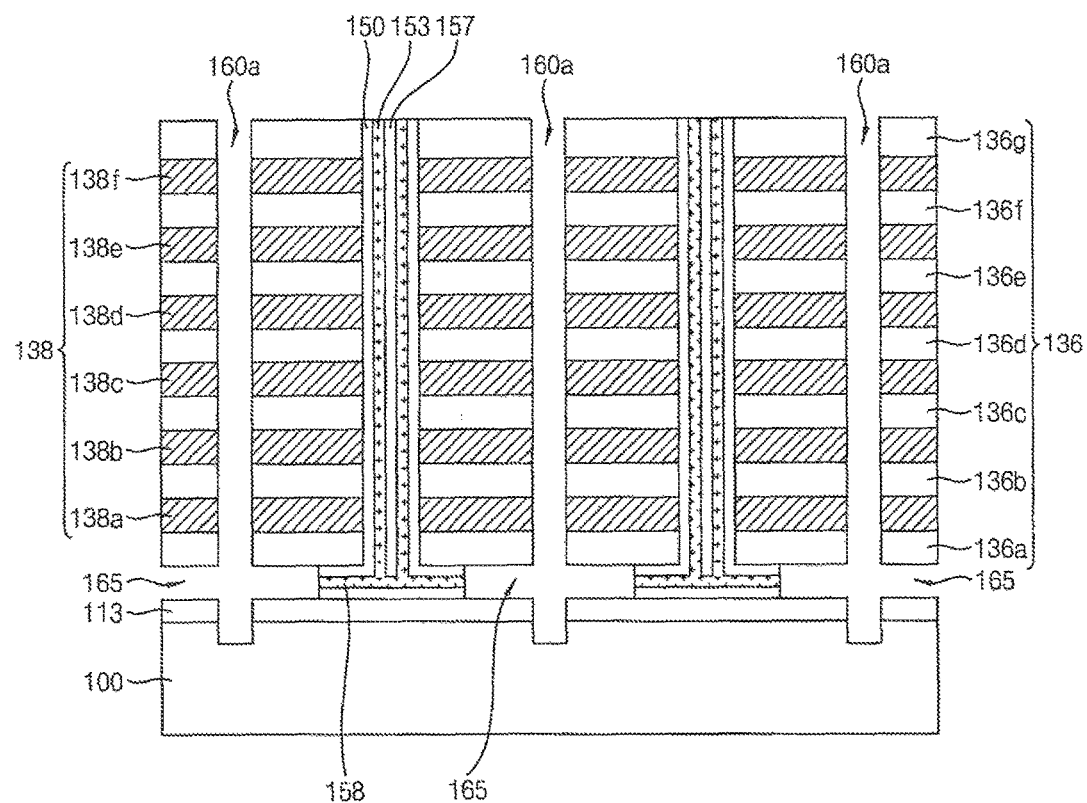
Figure 17:
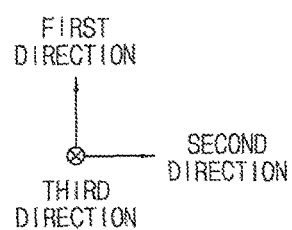

Referring to FIG. 17, processes substantially the same as or similar to those illustrated with reference to FIGS. 8 and 9 may be performed. Accordingly, the lower sacrificial pattern 123 exposed by the opening 160a may be removed to form a first gap 165. A lateral portion of the dielectric layer structure 150 exposed by the first gap 165 may be further removed such that the protrusion 158 may be exposed.

Figure 18:
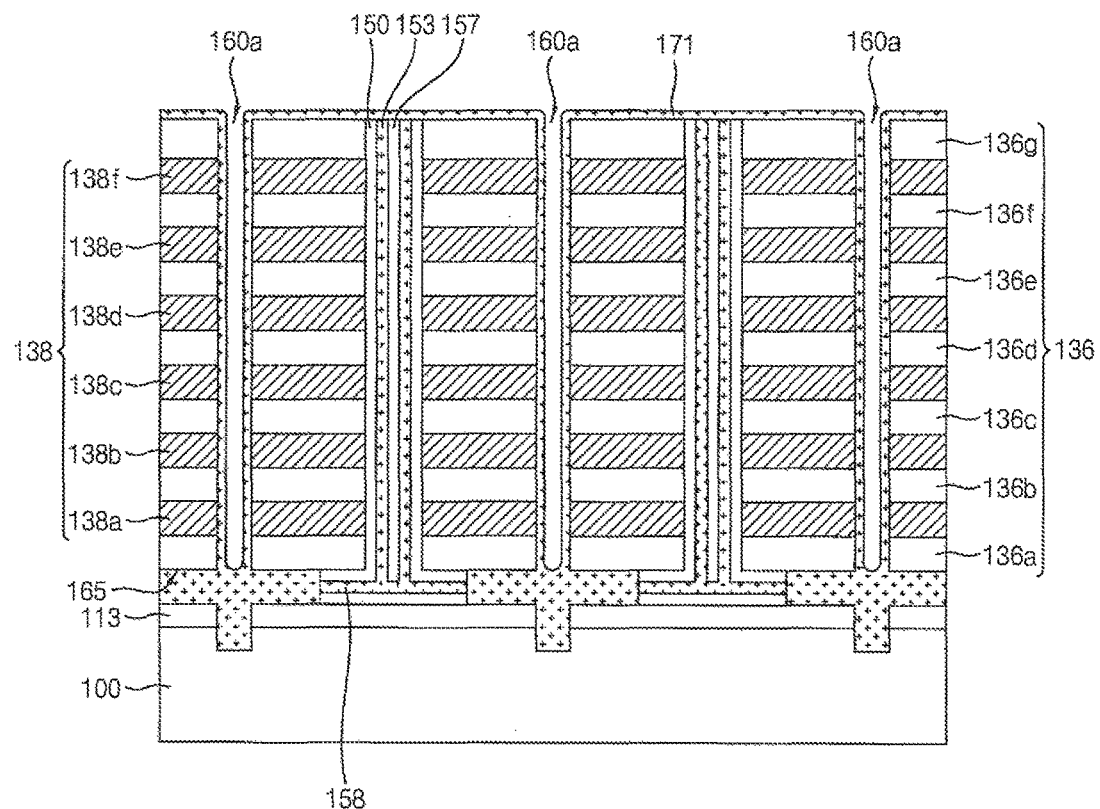
Figure 18:
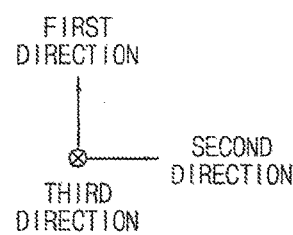

Referring to FIG. 18, a semiconductor layer 171 partially filling the opening 160a and completely filling the first gap 165 may be formed. The semiconductor layer 171 may be formed along top surfaces of an uppermost insulating interlayer pattern 136g and the vertical channel structure, and sidewalls of the openings 160a to fill a lower portion of the opening 160a.

In example embodiments, the semiconductor layer 171 may be formed of polysilicon or amorphous silicon by an ALD process or a sputtering process.

Figure 19:
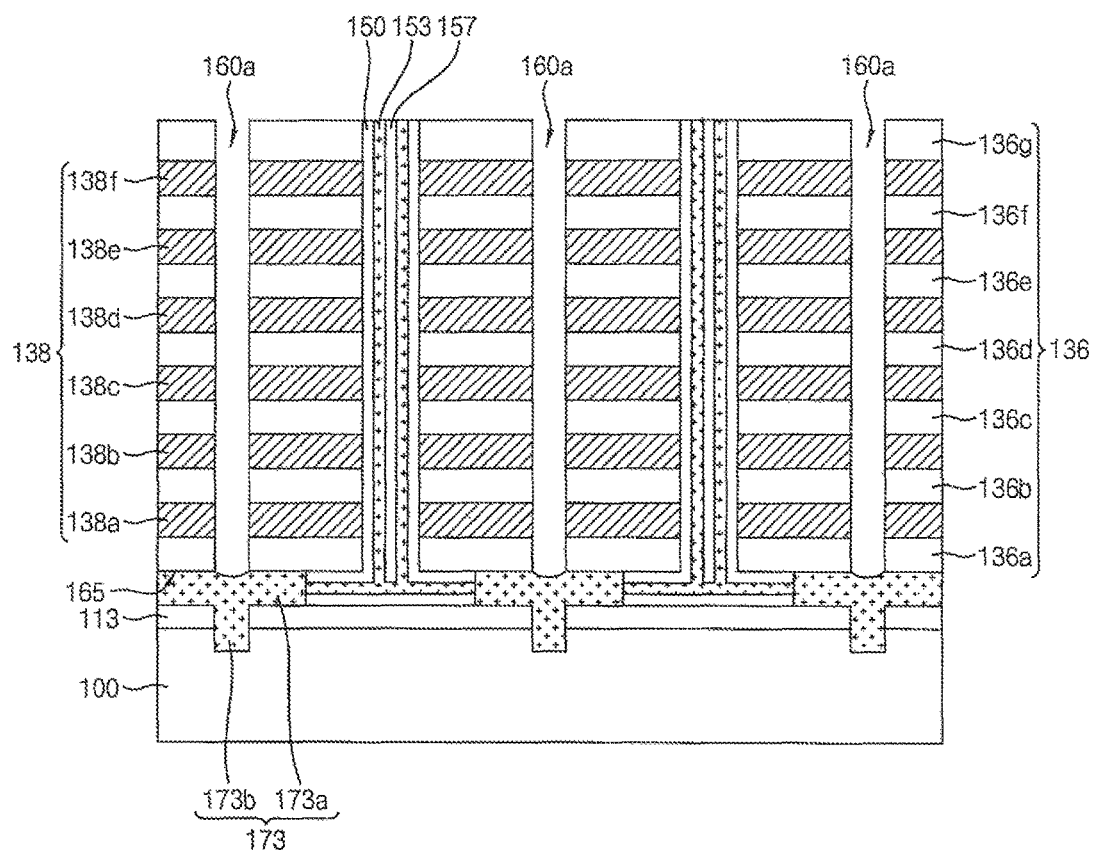

Referring to FIG. 19, an upper portion of the semiconductor layer 171 and a portion of the semiconductor layer 171 formed on a sidewall of the opening 160a may be removed by an etch-back process. Accordingly, a semiconductor pattern 173 filling the lower portion of the opening 160a and filling the first gap 165 may be formed.

As described above, the opening 160a may extend to the upper portion of the substrate 100 so that a depth or a length of the opening 160a may increase. Accordingly, an amount or a length of the semiconductor layer 171 removed by the etch-back process may be controlled. Thus, the semiconductor pattern 173 may be controlled to be formed below a lowermost insulating interlayer pattern 136a.

In example embodiments, a portion of the semiconductor pattern 173 filling the lower portion of the opening 160a may be defined as a vertical semiconductor pattern 173b. A portion of the semiconductor pattern 173 filling the first gap 165 may be defined as a horizontal semiconductor pattern 173a. As illustrated in FIG. 19, the vertical semiconductor pattern 173b may be partially buried in the upper portion of the substrate 100.

The horizontal semiconductor pattern 173a and the vertical semiconductor pattern 173b may be integrally connected to form the semiconductor pattern 173. The channel 153 and the substrate 100 may be connected to each other through the semiconductor pattern 173 and the protrusion 158. Thus, the horizontal semiconductor pattern 173a and the vertical semiconductor pattern 173b may be formed substantially simultaneously by a single deposition process without performing an SEG process.

Figure 20:
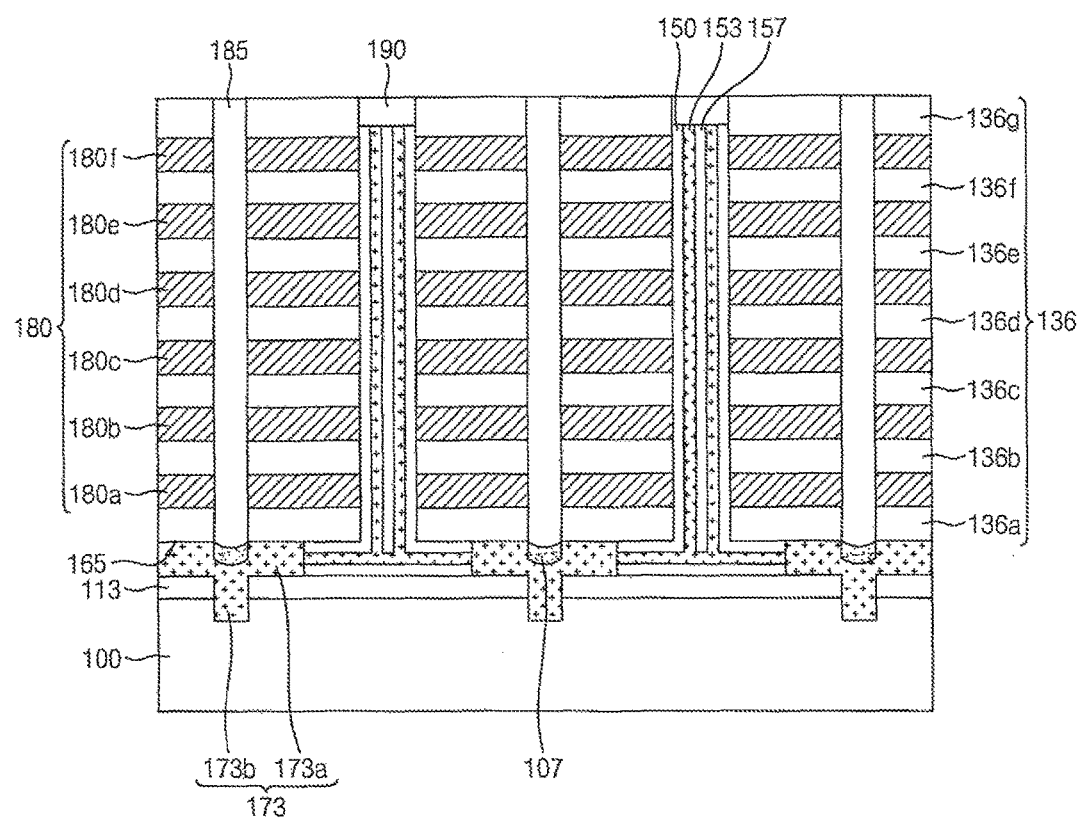
Figure 20:
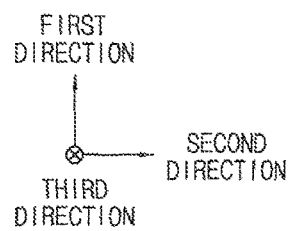

Referring to FIG. 20, processes substantially the same as or similar to those illustrated with reference to FIGS. 12 to 15 may be performed.

Accordingly, an ion-implantation process may be performed to form an impurity region 107 at an upper portion of the semiconductor pattern 173 and/or the vertical semiconductor pattern 173b. The sacrificial patterns 138 may be replaced with gate lines 180, and a second filling pattern 185 may be formed in the opening 160a. A pad 190 may be further formed at an upper portion of the vertical channel structure.

FIGS. 21 to 26 are cross-sectional views illustrating methods of manufacturing a vertical memory device in accordance with some example embodiments. Detailed description on processes substantially the same as or similar to those illustrated with reference to FIGS. 3 to 15 may be omitted.

Figure 21:
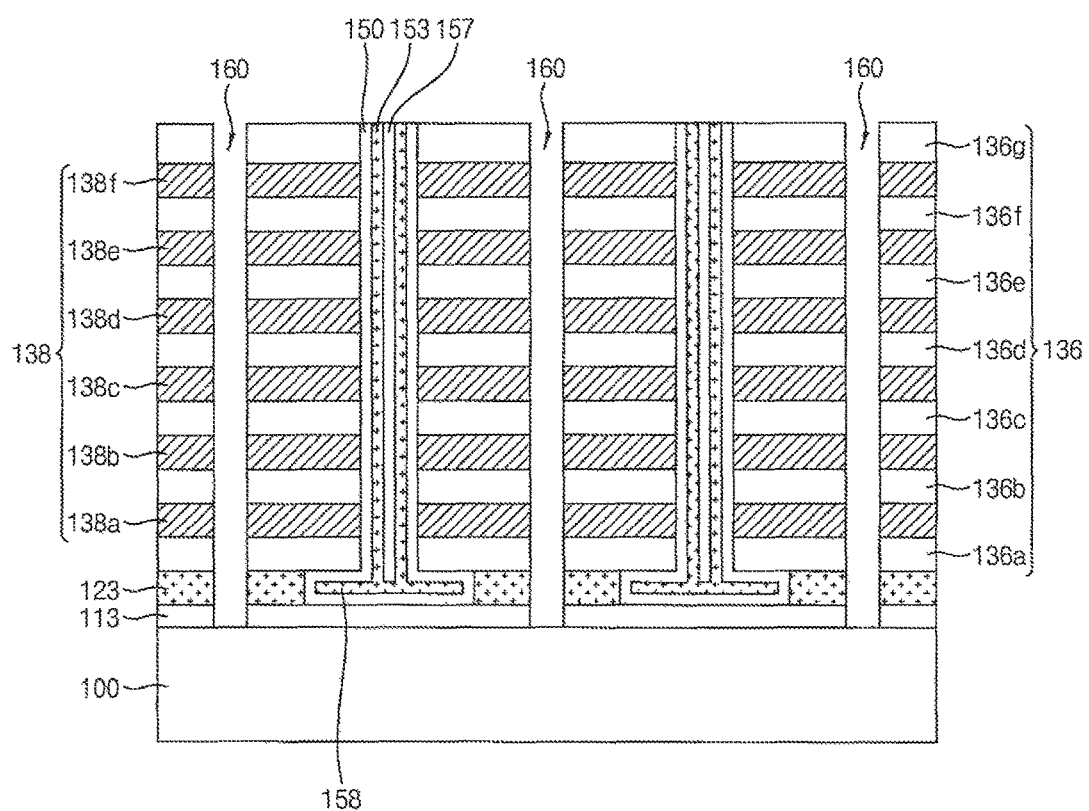

Referring to FIG. 21, processes substantially the same as or similar to those illustrated with reference to FIGS. 3 to 7 may be performed.

Accordingly, lower insulation patterns 113 and lower sacrificial patterns 123 separated by openings 160 may be formed. A mold structure including insulating interlayer patterns 136 and sacrificial patterns 138 alternately stacked may be formed on each lower sacrificial pattern 123. A vertical channel structure including a dielectric layer structure 150, a channel 153 and a first filling pattern 157 may be formed through the mold structure. The dielectric layer structure 150 and the channel 153 may be diverged in the second direction at a lower portion of the vertical channel structure. Accordingly, the channel 153 may include a protrusion 158 expanded in the second direction.

Figure 22:
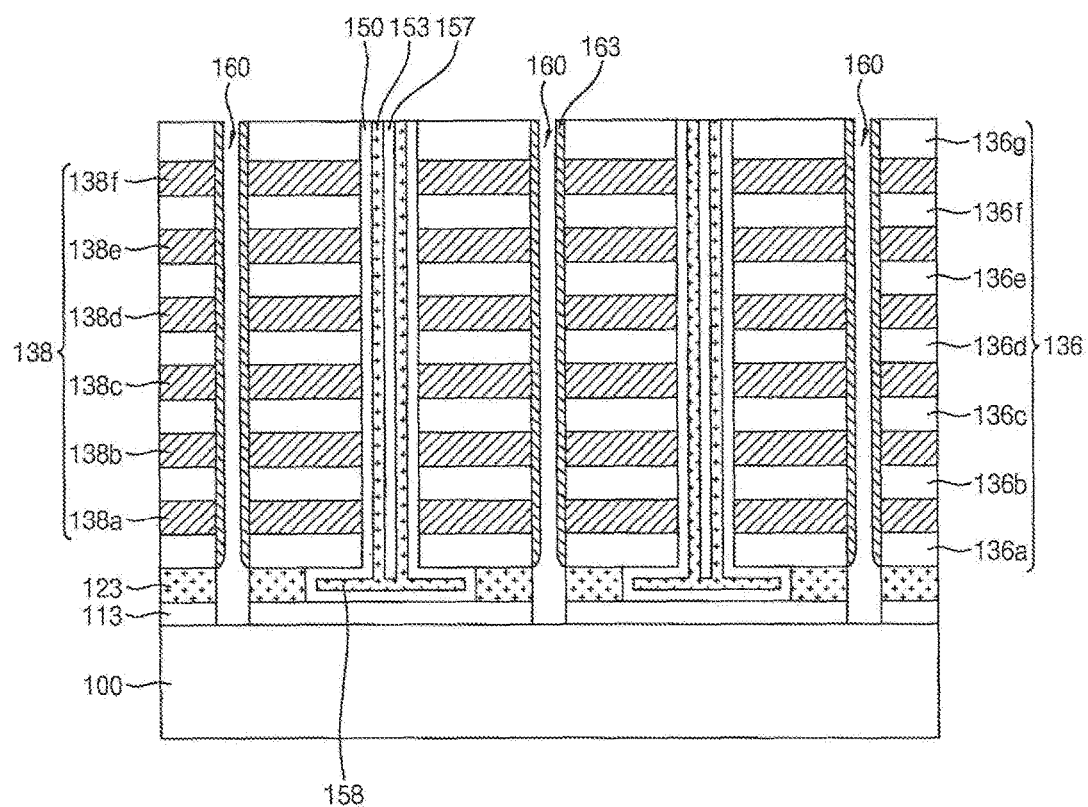

Referring to FIG. 22, a spacer 163 may be formed on sidewalls of the insulating interlayer patterns 136 and the sacrificial patterns 138 exposed through the opening 160.

In example embodiments, a spacer layer including silicon nitride may be formed selectively on top surfaces of an uppermost insulating interlayer pattern 136g and the vertical channel structure, and on a sidewall of the mold structure exposed by the opening 160 by controlling a step-coverage property of a deposition process. An upper portion of the spacer layer may be planarized by a CMP process to form the spacer 163. The spacer 163 may not be formed on a sidewall of the lower sacrificial pattern 123.

Figure 23:
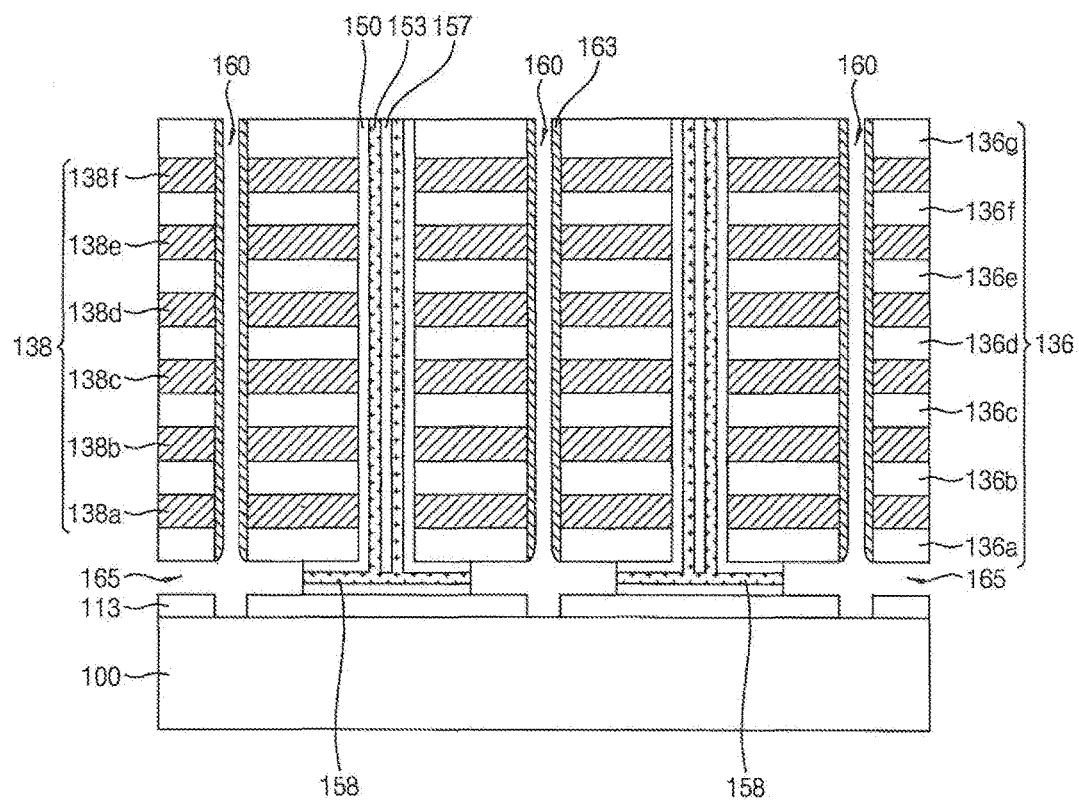
Figure 23:
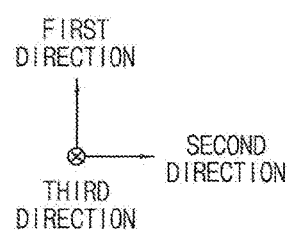

Referring to FIG. 23, processes substantially the same as or similar to those illustrated with reference to FIGS. 8 and 9 may be performed. Accordingly, the lower sacrificial patterns 123 exposed by the opening 160 may be removed to form a first gap 165. A lateral portion of the dielectric layer structure 150 exposed by the first gap 165 may be removed such that the protrusion 158 may be exposed.

In example embodiments, while performing the etching processes for removing the lower sacrificial pattern 123 and the dielectric layer structure 150, an etching damage of the mold structure may be prevented by the spacer 163.

Figure 24:
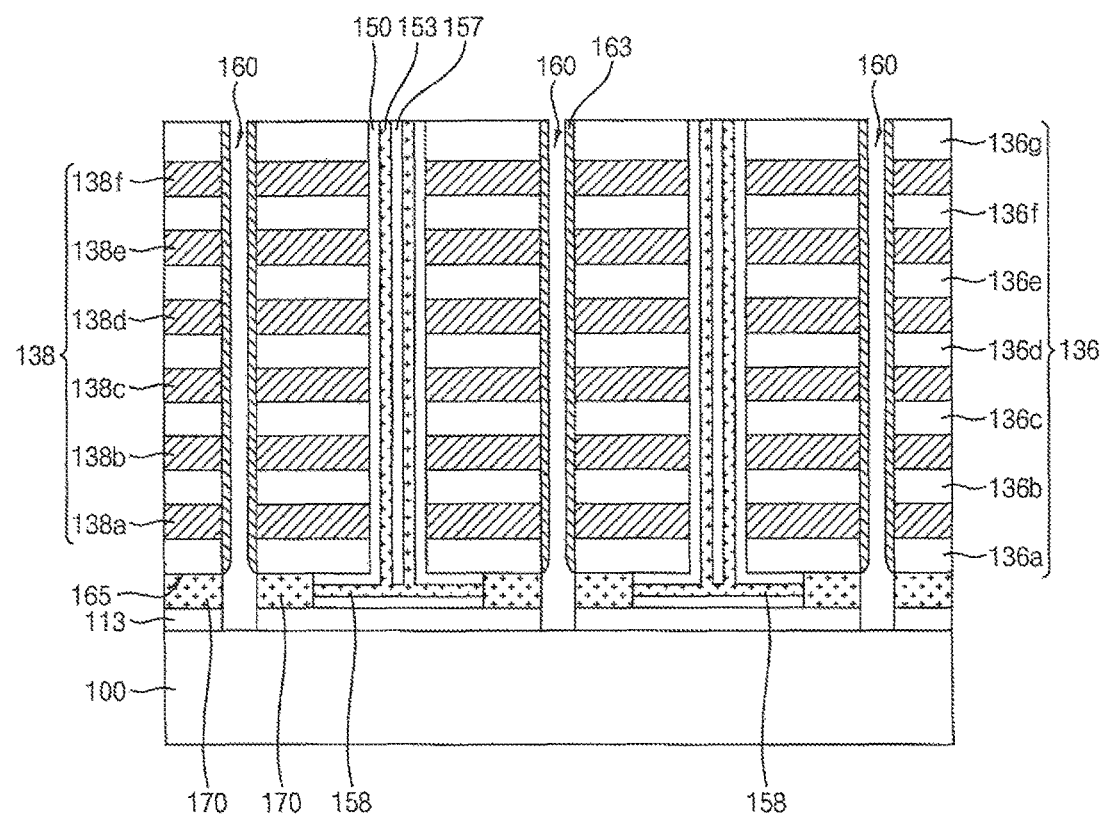

Referring to FIG. 24, a process substantially the same as or similar to that illustrated with reference to FIG. 10 may be performed to form a horizontal semiconductor pattern 170 filling the first gap 165 and contacting the protrusion 158.

Figure 25:
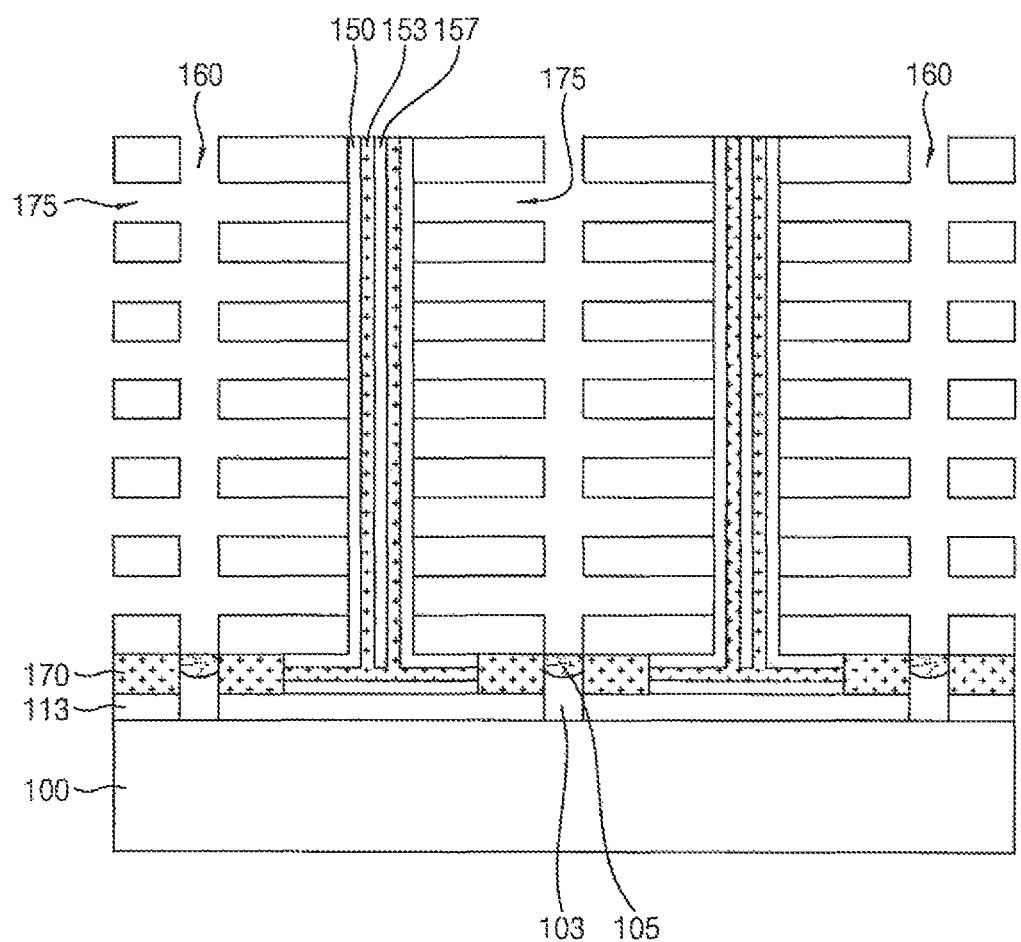

Referring to FIG. 25, processes substantially the same as or similar to those illustrated with reference to FIGS. 11 and 12 may be performed to form a vertical semiconductor pattern 103 protruding from a top surface of the substrate 100 and contacting the neighboring horizontal semiconductor patterns 170. An impurity region 105 may be formed at an upper portion of the vertical semiconductor pattern 103.

Subsequently, a process substantially the same as or similar to that illustrated with reference to FIG. 13 may be performed such that the sacrificial patterns 138 may be removed to form second gaps 175. The spacer 163 including silicon nitride substantially the same as or similar to that of the sacrificial pattern 138 may be also removed together with the sacrificial patterns 138.

Figure 26:
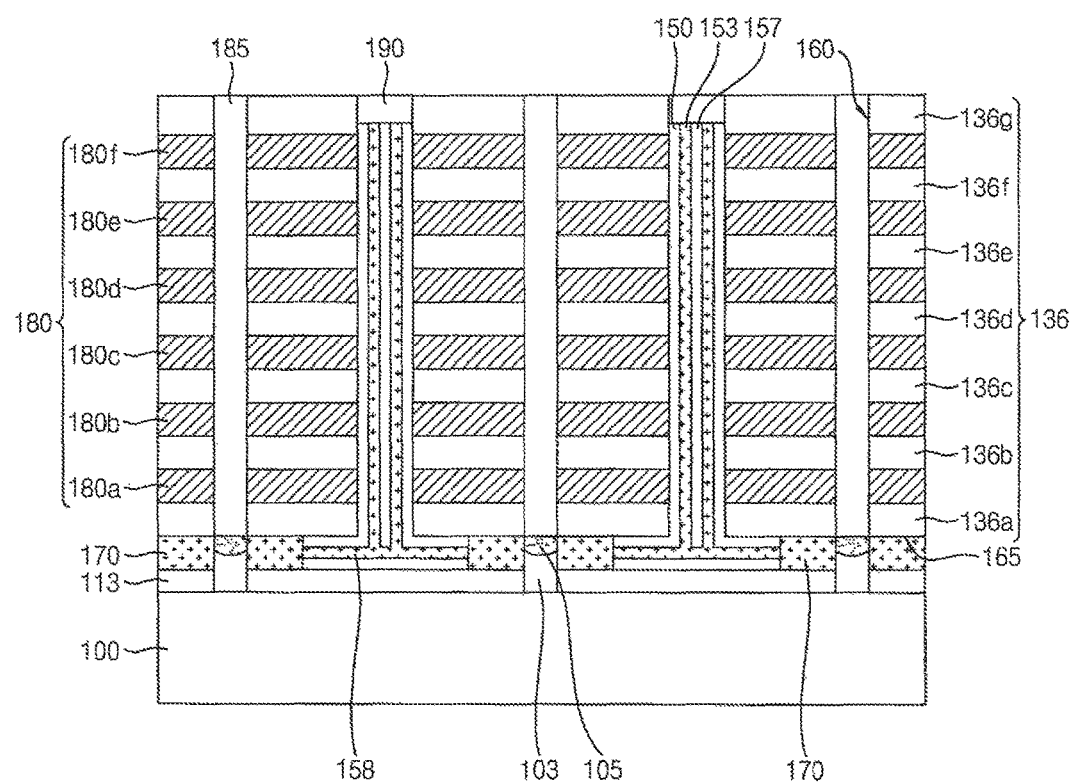

Referring to FIG. 26, processes substantially the same as or similar to those illustrated with reference to FIGS. 14 and 15 may be performed.

Accordingly, a gate line 180 may be formed in the second gap 175 at each level, and a second filling pattern 185 may be formed in the opening 160. A pad 190 may be further formed at an upper portion of the vertical channel structure.

FIGS. 27 to 32 are cross-sectional views illustrating methods of manufacturing a vertical memory device in accordance with example embodiments. For example, FIGS. 27 to 32 are cross-sectional views illustrating a method of manufacturing the vertical memory device of FIG. 2.

Detailed descriptions on processes substantially the same as or similar to those illustrated with reference to FIGS. 3 to 15 are omitted herein.

Figure 27:
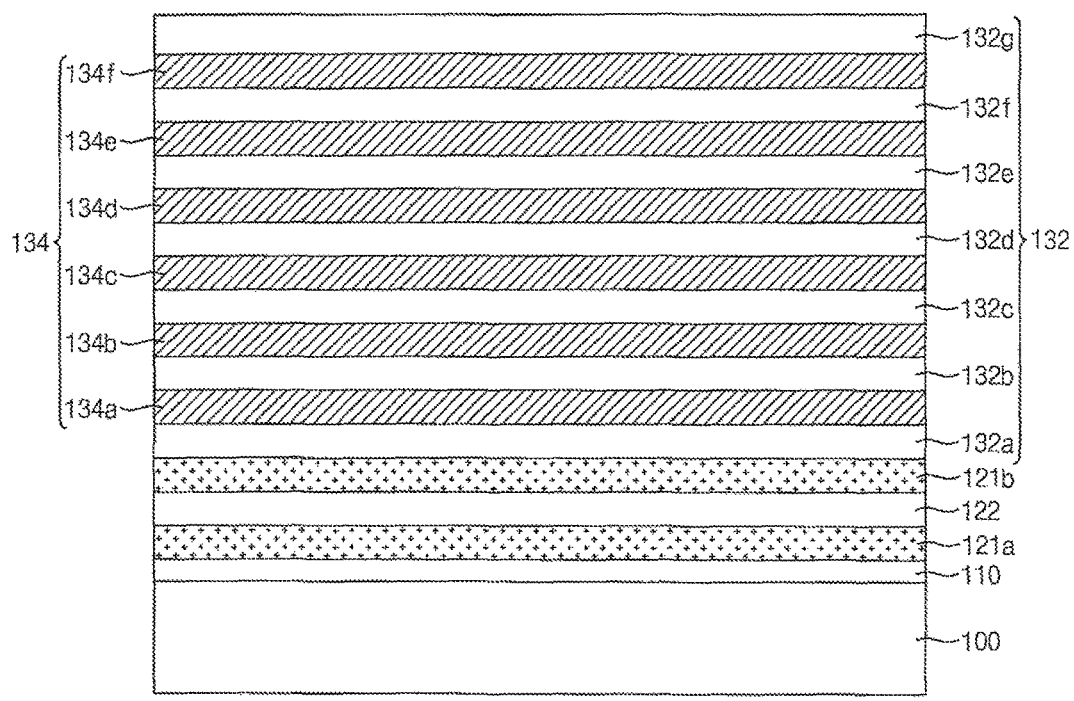
Figure 27:
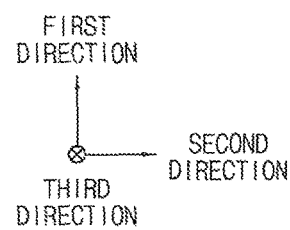

Referring to FIG. 27, a lower insulation layer 110, a first lower sacrificial layer 121a, a separation layer 122 and a second lower sacrificial layer 121b may be sequentially formed on a substrate 100. Insulating interlayers 132 and sacrificial layers 134 may be repeatedly and alternately formed on the second lower sacrificial layer 121b to form a mold structure.

The lower insulation layer 110 and the separation layer 122 may be formed of silicon oxide. The first and second lower sacrificial layers 121a and 121b may be formed of a silicon compound such as polysilicon or amorphous silicon.

Figure 28:
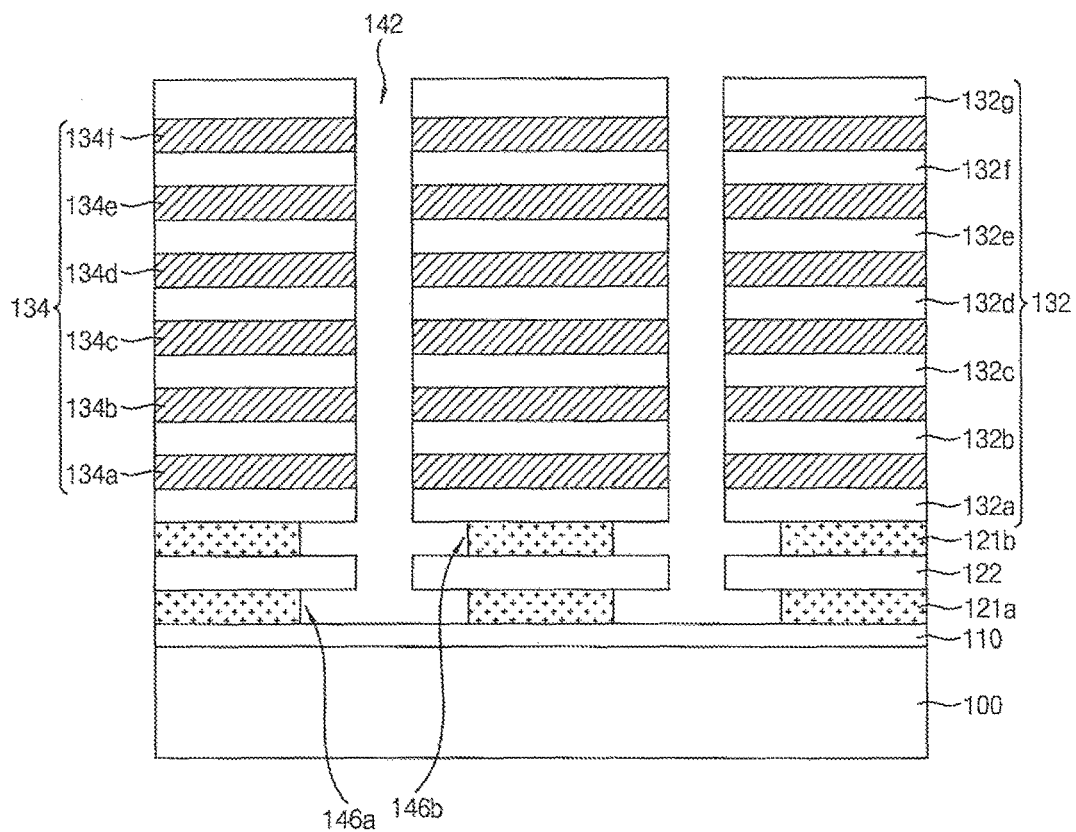
Figure 28:
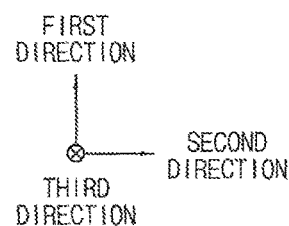

Referring to FIG. 28, processes substantially the same as or similar to those illustrated with reference to FIGS. 4 and 5 may be performed.

Accordingly, a channel hole 142 may be formed through the mold structure, the second lower sacrificial layer 121b, the separation layer 122 and the first lower sacrificial layer 121a. The first and second lower sacrificial layers 121a and 121b exposed by the channel hole 142 may be partially removed by a GPE process to form a first recess 146a and a second recess 146b. The first and second recesses 146a and 146b may be spaced apart from each other in the first direction by the separation layer 122.

Figure 29:
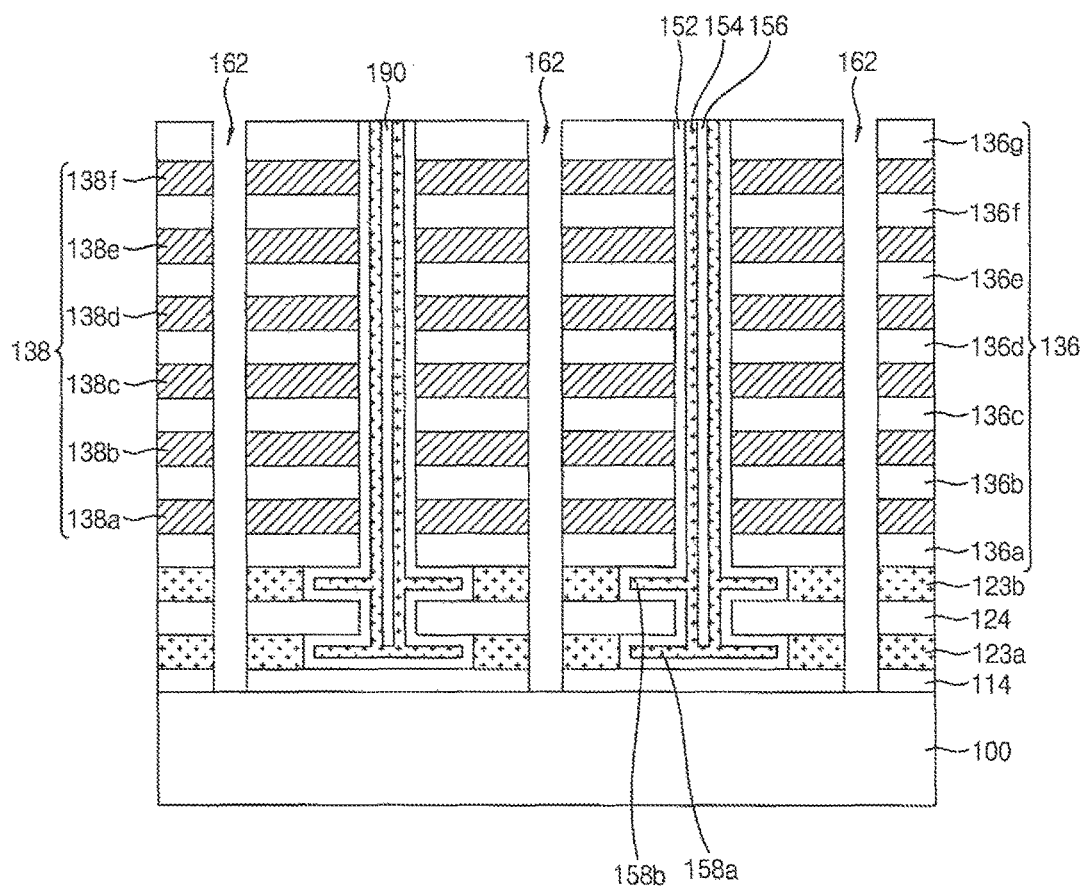

Referring to FIG. 29, a process substantially the same as or similar to that illustrated with reference to FIG. 6 may be performed to form a vertical channel structure filling the channel hole 142 and the recesses 145a and 146b, and including a dielectric layer structure 152, a channel 154 and a first filling pattern 156.

The dielectric structure 152 may be formed conformally along inner walls of the channel hole 142, the first recess 146a and the second recess 146b. The channel 154 may fill the first and second recesses 146a and 146b, and may partially fill the channel hole 142. The first filling pattern 156 may fill a remaining portion of the channel hole 142.

In example embodiments, portions of the channel 154 formed in the first recess 146a and the second recess 146b may be defined as a first protrusion 158a and a second protrusion 158b, respectively.

Subsequently, a process substantially the same as or similar to that illustrated with reference to FIG. 7 may be performed to form an opening 162.

After the formation of the opening 162, the insulating interlayers 132 and the sacrificial layers 134 may be changed into insulating interlayer patterns 136 and sacrificial patterns 138. The second lower sacrificial layer 121b, the separation layer 122 and the first lower sacrificial layer 121a may be changed into second lower sacrificial patterns 123b, separation layer patterns 124 and first lower sacrificial patterns 123a, respectively. Further, the lower insulation layer 110 may be separated into a plurality glower insulation patterns 114.

Figure 30:
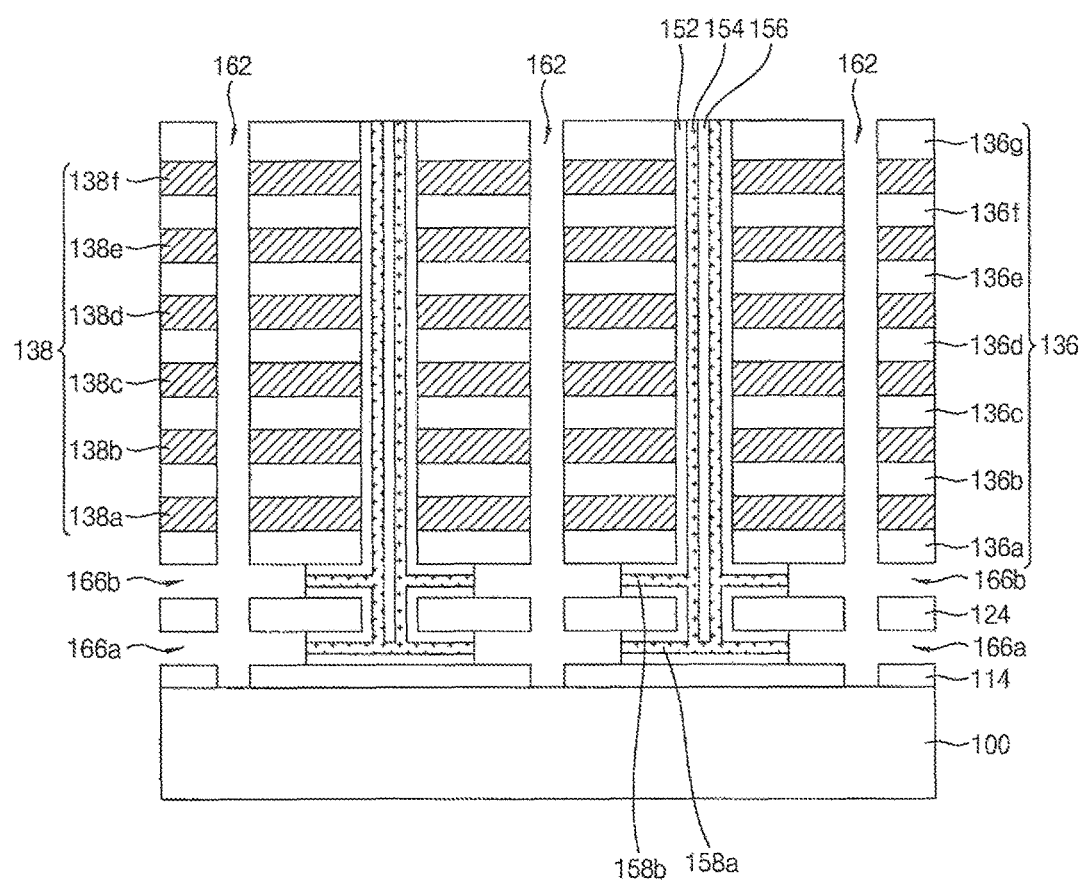

Referring to FIG. 30, processes substantially the same as or similar to those illustrated with reference to FIGS. 8 and 9 may be performed.

In example embodiments, the first and second lower sacrificial patterns 123a and 123b may be removed by a GPE process to form a first lower gap 166a and a second lower gap 166b. Portions of the dielectric layer structure 152 exposed by the first lower gap 166a and the second lower gap 166b may be removed by, e.g., a wet etching process. Accordingly the first protrusion 158a and the second protrusion 158b may be exposed through the first lower gap 166a and the second lower gap 166b, respectively.

In some embodiments, as also illustrated with reference to FIG. 22, a spacer may be further formed on a sidewall of the mold structure exposed through the opening 162 before performing the GPE process and/or the wet etching process.

Figure 31:
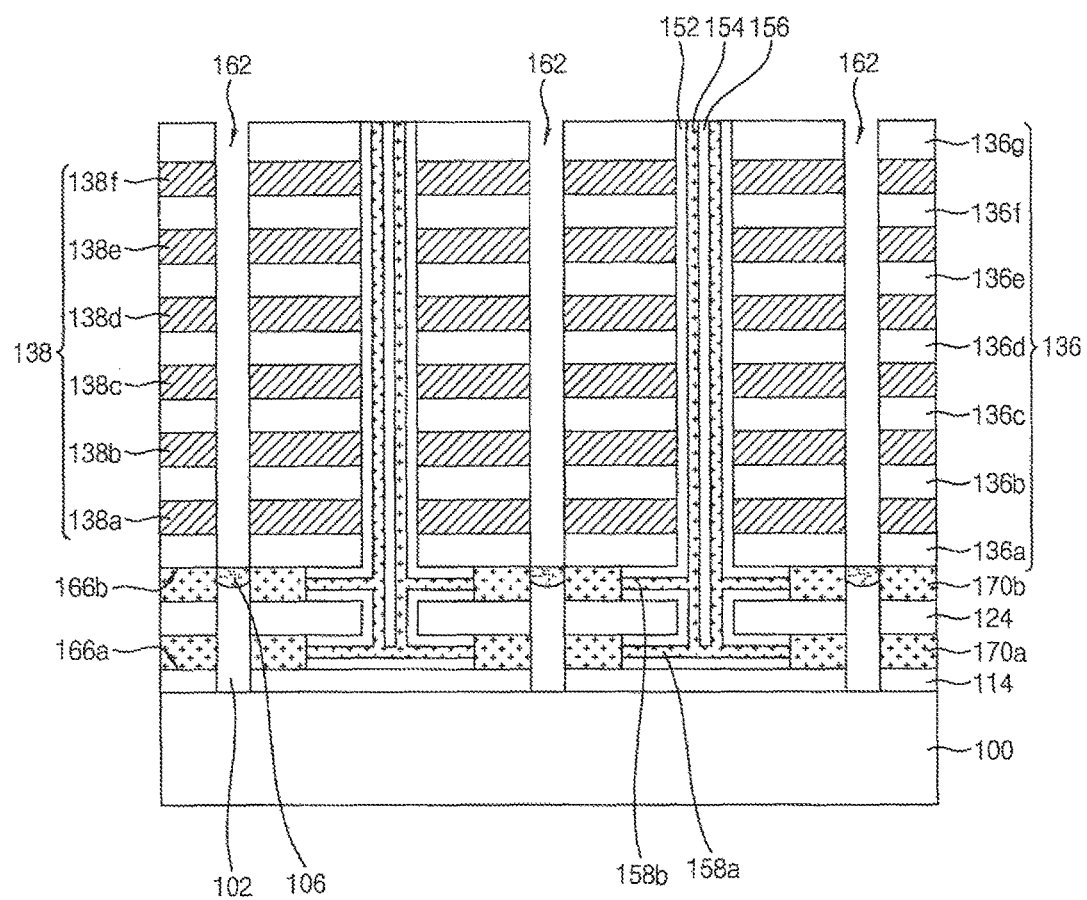

Referring to FIG. 31, processes substantially the same as or similar to those illustrated with reference to FIGS. 10 to 12 may be performed.

In example embodiments, a first horizontal semiconductor pattern 170a and a second horizontal semiconductor pattern 170b may be formed in the first lower gap 166a and the second lower gap 166b, respectively. The first horizontal semiconductor pattern 170a and the second horizontal semiconductor pattern 170b may contact the first protrusion 158a and the second protrusion 158b, respectively. A vertical semiconductor pattern 102 may be formed from a top surface of the substrate 100 exposed through the opening 162 by an SEG process. The vertical semiconductor pattern 102 may protrude in the first direction, and may contact the first and second horizontal semiconductor patterns 170a and 170b. An impurity region 106 may be formed at an upper portion of the vertical semiconductor pattern 102.

In some embodiments, as also illustrated with reference to FIGS. 18 and 19, the first horizontal semiconductor pattern 170a, the second horizontal semiconductor pattern 170b and the vertical semiconductor pattern 102 may be formed from substantially the same deposition process without performing the SEG process. In this case, the first horizontal semiconductor pattern 170a, the second horizontal semiconductor pattern 170b and the vertical semiconductor pattern 102 may be provided as a single or unitary member. In other words, the first horizontal semiconductor pattern 170a, the second horizontal semiconductor pattern 170b and the vertical semiconductor pattern 102 may be integral with each other. The vertical semiconductor pattern 102 may be partially buried at an upper portion of the substrate 100.

Figure 32:
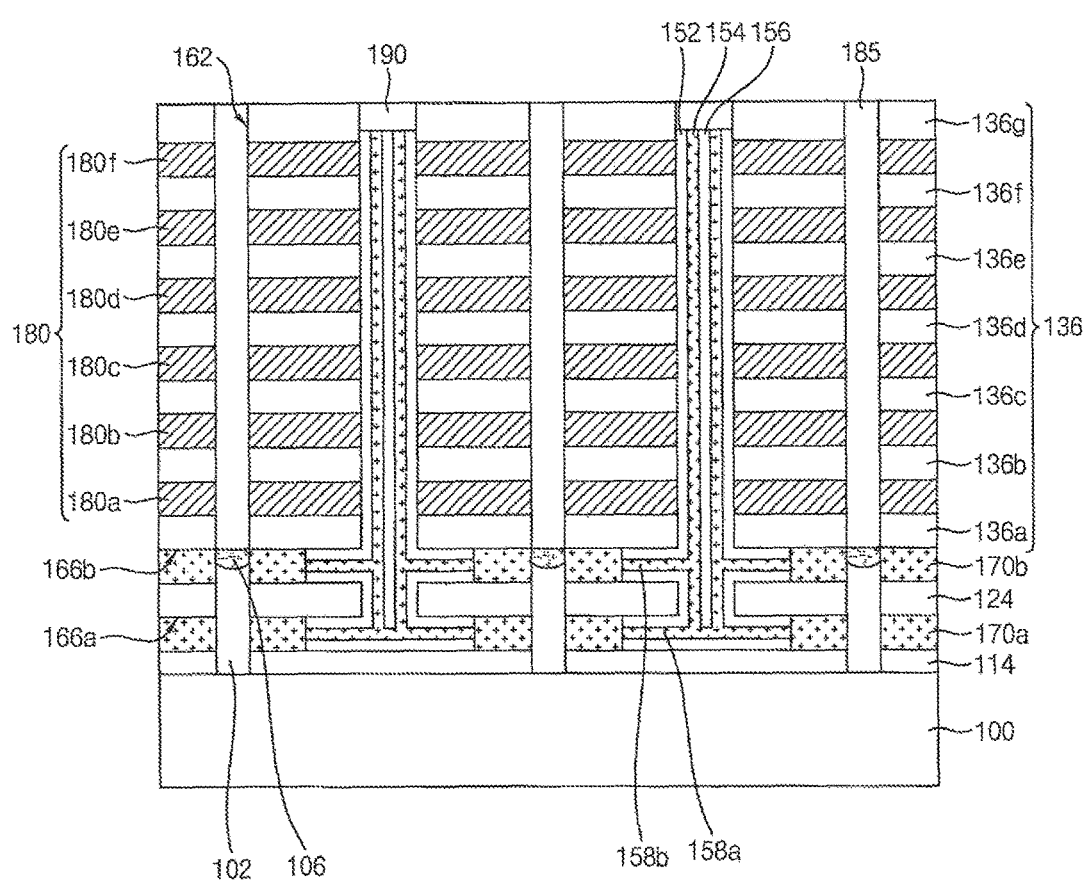
Figure 32:
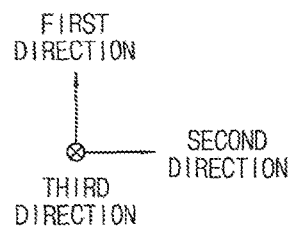

Referring to FIG. 32, processes substantially the same as or similar to those illustrated with reference to FIGS. 13 to 15 may be performed.

For example, the sacrificial patterns 138 may be replaced with the gate lines 180, and a second filling pattern 185 may be formed in the opening 162. A pad 190 may be further formed at an upper portion of the vertical channel structure.

Figure 33:
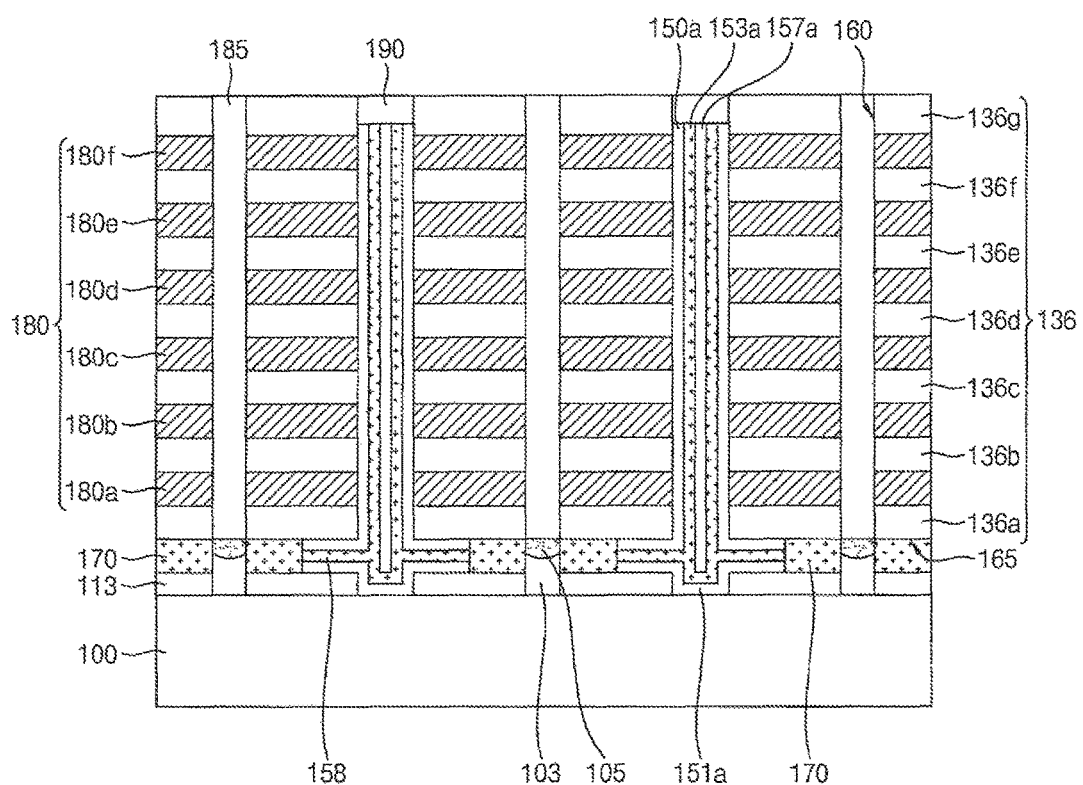
Figure 33:
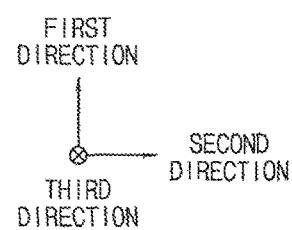

FIG. 33 is a cross-sectional view illustrating a vertical memory device in accordance with some example embodiments. The vertical memory device of FIG. 33 may have elements and/or constructions substantially the same as or similar to those illustrated with reference to FIG. 1 except for a construction of a vertical channel structure. Thus, detailed descriptions on repeated elements and structures are omitted herein, and like reference numerals are used to designate like elements.

Referring to FIG. 33, the vertical channel structure may include a dielectric layer structure 150a, a channel 153a and a first filling pattern 157a. The vertical channel structure may extend through the lower insulation pattern 113 and may contact a top surface of the substrate 100.

In example embodiments, a lower portion 151a of the dielectric layer structure 150a may support a lower portion of the channel 153a including a protrusion 158, and may contact the top surface of the substrate 100. The channel 153a may be formed on the lower portion 151a of the dielectric layer structure 150a, and may not contact the top surface of the substrate 100. A connection between the channel 153a and the substrate 100 may be realized through the protrusion 158, a horizontal semiconductor pattern 170 and a vertical semiconductor pattern 103 as also illustrated with reference to FIG. 1.

For example, while forming the channel hole 140 as illustrated in FIG. 4, the lower insulation layer 110 may be also etched so that the top surface of the substrate 100 may be exposed. Accordingly, the lower portion 151a of the dielectric layer structure 150a may be formed to be in contact with the top surface of the substrate 100 as illustrated in FIG. 33.

Figure 34:
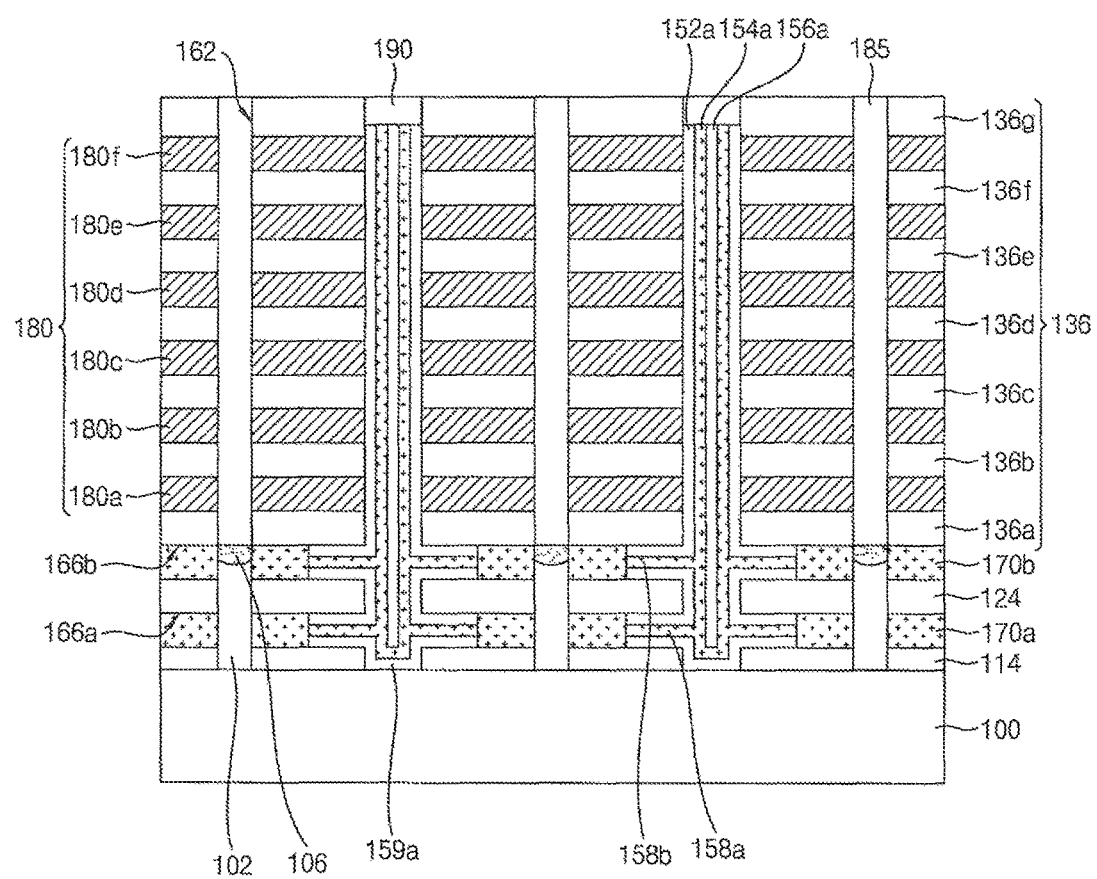

FIG. 34 is a cross-sectional view illustrating a vertical memory device in accordance with some example embodiments. The vertical memory device of FIG. 34 may have elements and/or constructions substantially the same as or similar to those illustrated with reference to FIG. 2 except for a construction of a vertical channel structure. Thus, detailed descriptions on repeated elements and structures are omitted herein, and like reference numerals are used to designate like elements.

Referring to FIG. 34, the vertical channel structure may include a dielectric layer structure 152a, a channel 154a and a first filling pattern 156a. The vertical channel structure may extend through the lower insulation pattern 114 and may contact a top surface of the substrate 100.

In example embodiments, a lower portion 159a of the dielectric layer structure 152a may support a lower portion of the channel 154a including a first protrusion 158a, and may contact the top surface of the substrate 100. The channel 154a may be formed on the lower portion 159a of the dielectric layer structure 152a, and may not contact the top surface of the substrate 100. A connection between the channel 154a and the substrate 100 may be realized through first and second protrusions 158a and 158b, first and second horizontal semiconductor patterns 170a and 170b, and a vertical semiconductor pattern 102 as also illustrated with reference to FIG. 2.

For example, while forming the channel hole 142 as illustrated in FIG. 28, the lower insulation layer 110 may be also etched so that the top surface of the substrate 100 may be exposed. Accordingly, the lower portion 159a of the dielectric layer structure 152a may be formed to be in contact with the top surface of the substrate 100 as illustrated in FIG. 34.

According to example embodiments of the present inventive concepts, a vertical channel included in a vertical memory device may include at least one protrusion diverged laterally from a lower portion thereof. The vertical enamel and a substrate may be connected through the protrusion. Thus, for example, an etch-back process for connecting the vertical channel and the substrate may be omitted so that the vertical memory device having improved reliability may be obtained.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
   a substrate;
   a channel on the substrate, extending in a vertical direction with respect to a top surface of the substrate, and including a protrusion at a lower portion of the channel, the protrusion extending in a parallel direction with respect to the top surface of the substrate;
   a semiconductor pattern extending from the protrusion to the substrate; and
   gate lines stacked and spaced apart from each other in the vertical direction, the gate lines on the protrusion and the semiconductor pattern and surrounding the channel,
   wherein a portion of the semiconductor pattern and a portion of the protrusion are equidistant from the top surface of the substrate in a perpendicular direction with respect to the top surface of the substrate.

2. The vertical memory device of claim 1, wherein the semiconductor pattern includes at least one of polysilicon, amorphous silicon and single crystalline silicon.

3. The vertical memory device of claim 1, where n the semiconductor pattern includes:
   a horizontal semiconductor pattern physically contacting the protrusion; and
   a vertical semiconductor pattern protruding from the top surface of the substrate and physically contacting the horizontal semiconductor pattern.

4. The vertical memory device of claim 3, further comprising an impurity region at an upper portion of the vertical semiconductor pattern,
   wherein a lowermost portion of the impurity region is farther from the top surface of the substrate than a lowermost portion of the channel.

5. The vertical memory device of claim 3, wherein the protrusion includes a first protrusion and a second protrusion spaced apart from each other in the vertical direction.

6. The vertical memory device of claim 5, wherein the horizontal semiconductor pattern includes a first horizontal semiconductor pattern and a second horizontal semiconductor pattern physically contacting the first protrusion and the second protrusion, respectively, and
   wherein the vertical semiconductor pattern physically contacts each of the first horizontal semiconductor pattern and the second horizontal semiconductor pattern.

7. The vertical memory device of claim 6, further comprising an impurity region at an upper portion of the vertical semiconductor pattern adjacent to the second horizontal semiconductor pattern,
   wherein a lowermost portion of the impurity region is farther from the top surface of the substrate than a lowermost portion of the channel.

8. The vertical memory device of claim 1, further comprising a dielectric layer structure on an outer sidewall of the channel,
   wherein a portion of the dielectric layer structure covers a bottom surface of the channel and a bottom surface of the protrusion.

9. The vertical memory device of claim 8, further comprising a lower insulation layer on the top surface of the substrate,
   wherein the portion of the dielectric layer structure is on the lower insulation layer.

10. A vertical memory device, comprising:
    a substrate on which a plurality of lower insulation patterns are arranged in a third direction in parallel with a top surface of the substrate such that adjacent ones of the plurality of lower insulation patterns are spaced apart from each other by an opening through which the substrate is partially exposed;
    a semiconductor pattern extending in the third direction around a lateral portion of a first lower insulation pattern of the plurality of lower insulation patterns and making contact with the substrate in the opening;
    gate lines stacked over the plurality of lower insulation patterns and spaced apart from each other in a first direction vertically with respect to the top surface of the substrate; and
    a channel extending through the gate lines in the first direction and having a ring-shaped protrusion that expands outwards, from a lower portion of the channel in a second direction crossing the first direction and the third direction, the ring-shaped protrusion making contact with the semiconductor pattern under a lowermost line of the gate lines.

11. The vertical memory device of claim 10, wherein the semiconductor pattern comprises:
    a horizontal semiconductor pattern disposed on a top surface of the first lower insulation pattern and making contact with the ring-shaped protrusion; and
    a vertical semiconductor pattern disposed on the substrate exposed through the opening and making contact with the horizontal semiconductor pattern.

12. The vertical memory device of claim 11, further comprising an impurity region at an upper portion of the vertical semiconductor pattern and making contact with the horizontal semiconductor pattern.

13. The vertical memory device of claim 11, wherein the ring-shaped protrusion comprises a first protrusion and a second protrusion that are spaced apart from each other in the first direction by a separation layer pattern.

14. The vertical memory device of claim 13, wherein the horizontal semiconductor pattern comprises a first horizontal semiconductor pattern and a second horizontal semiconductor pattern that are spaced apart from each other in the first direction by the separation layer pattern and make contact with the first protrusion and the second protrusion, respectively, and wherein the vertical semiconductor pattern makes contact with the first horizontal semiconductor pattern, and the second horizontal semiconductor pattern, and the separation layer pattern.

15. The vertical memory device of claim 14, further comprising an impurity region at an upper portion of the vertical semiconductor pattern and making contact with the second horizontal semiconductor pattern.

16. The vertical memory device of claim 15, wherein the vertical semiconductor pattern, the second horizontal semiconductor pattern, and the second protrusion of the channel provide an electron transfer path between the impurity region and the channel, and wherein the vertical semiconductor pattern, the first horizontal semiconductor pattern, and the first protrusion of the channel provide a hole transfer path between the channel and the substrate.

17. The vertical memory device of claim 13, wherein the separation layer pattern includes a silicon-oxide based material.

18. The vertical memory device of claim 11, further comprising a dielectric layer structure on an outer sidewall of the channel such, that the dielectric layer structure makes contact with a bottom surface of the channel and a bottom surface of the ring-shaped protrusion on the first lower insulation pattern.

19. The vertical memory device of claim 18, wherein the horizontal semiconductor pattern makes contact with the dielectric layer structure and the ring-shaped protrusion of the channel.

* * * * *